United States Patent
Moses et al.

(10) Patent No.: US 10,140,233 B2
(45) Date of Patent: Nov. 27, 2018

(54) MASS STORAGE DEVICE SELECTOR

(71) Applicants: Donald Moses, Laval-Ouest (CA); Serge Moses, Montreal (CA)

(72) Inventors: Donald Moses, Laval-Ouest (CA); Serge Moses, Montreal (CA)

(*) Notice: Subject to any disclaimer, the term of this patent is extended or adjusted under 35 U.S.C. 154(b) by 236 days.

(21) Appl. No.: 15/101,408

(22) PCT Filed: Dec. 8, 2014

(86) PCT No.: PCT/CA2014/000879
§ 371 (c)(1),
(2) Date: Jun. 2, 2016

(87) PCT Pub. No.: WO2015/085401
PCT Pub. Date: Jun. 18, 2015

(65) Prior Publication Data
US 2017/0212859 A1    Jul. 27, 2017

(30) Foreign Application Priority Data

Dec. 9, 2013 (GB) .................................... 1321685
Jul. 11, 2014 (GB) .................................... 1412361

(51) Int. Cl.
| G06F 13/00 | (2006.01) |
| G06F 13/40 | (2006.01) |
| G06F 3/06  | (2006.01) |
| G06F 1/26  | (2006.01) |
| G06F 13/16 | (2006.01) |
| G11C 7/10  | (2006.01) |
| G06F 9/4401| (2018.01) |

(52) U.S. Cl.
CPC .......... *G06F 13/4022* (2013.01); *G06F 1/266* (2013.01); *G06F 3/0605* (2013.01); *G06F 3/0635* (2013.01); *G06F 9/4411* (2013.01); *G06F 13/1689* (2013.01); *G06F 13/4068* (2013.01); *G11C 7/106* (2013.01); *G06F 3/0622* (2013.01); *G06F 3/0632* (2013.01); *G06F 3/0683* (2013.01)

(58) Field of Classification Search
None
See application file for complete search history.

(56) References Cited

U.S. PATENT DOCUMENTS

| 6,957,286 B1 * | 10/2005 | Cohen ..................... G06F 9/441 710/38 |
| 8,190,871 B2 | 5/2012 | Sheets et al. |
| 2004/0049633 A1 | 3/2004 | Suzuki et al. |
| 2006/0271776 A1 | 11/2006 | Murphy |

(Continued)

FOREIGN PATENT DOCUMENTS

WO    2001020467    3/2001

OTHER PUBLICATIONS

European Search Report for Euroean Patent Application 140869141.3 Corresponding to the present US application issued by the European Patent Office dated Aug. 31, 2017.

*Primary Examiner* — Hyun Nam

(57) ABSTRACT

A mass storage device selector (1000) operatively couplable between a host computer (12) and a plurality of mass storage devices (14), for allowing a user of the host computer (12) to securely and exclusively select, access and interface with only one of the mass storage devices (14) operatively coupled thereto.

38 Claims, 8 Drawing Sheets

(56) References Cited

U.S. PATENT DOCUMENTS

| | | |
|---|---|---|
| 2007/0214331 A1 | 9/2007 | Murphy |
| 2010/0037043 A1 | 2/2010 | Sheets et al. |
| 2012/0284494 A1* | 11/2012 | Funk .................... G06F 9/4401 |
| | | 713/2 |

* cited by examiner

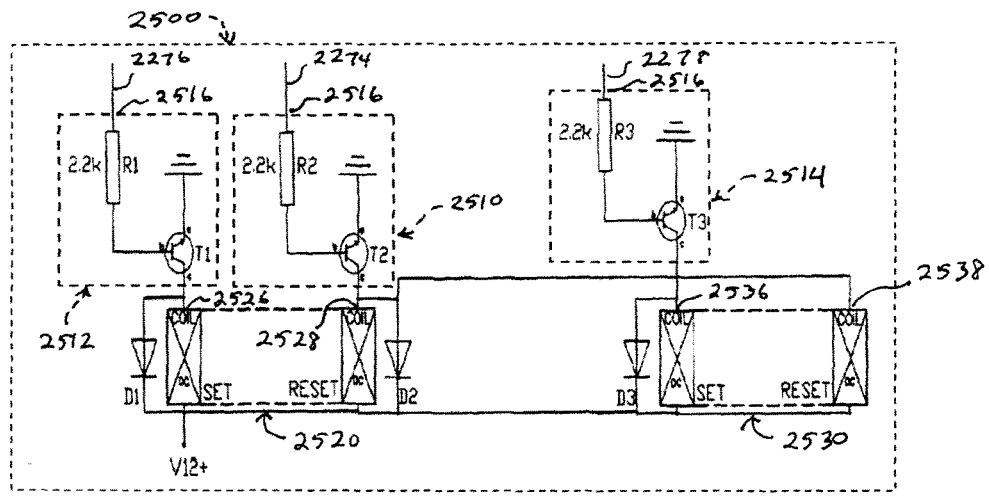
FIG. 13
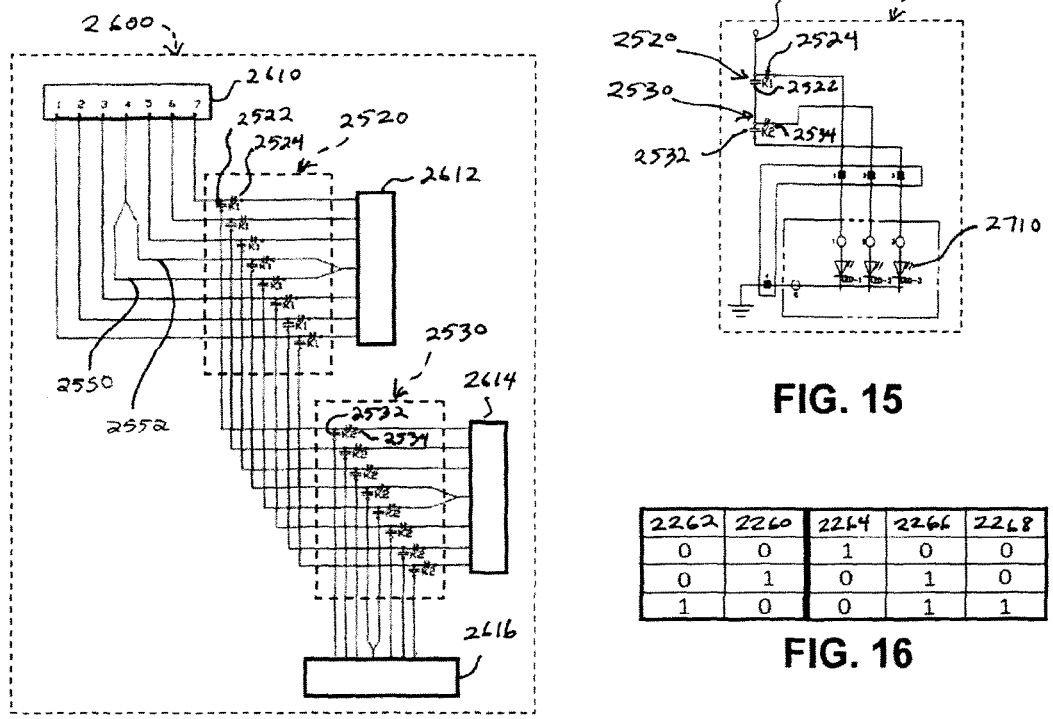
FIG. 14
FIG. 15
| 2262 | 2260 | 2264 | 2266 | 2268 |
|------|------|------|------|------|
| 0 | 0 | 1 | 0 | 0 |
| 0 | 1 | 0 | 1 | 0 |
| 1 | 0 | 0 | 1 | 1 |
FIG. 16
| | 2112A | 2112B | 2112C | 2278 | 2276 | 2274 |
|---|---|---|---|---|---|---|
| INIT | × | × | × | 0 | 0 | ⊓ |
| SATA1 | 1 | 0 | 0 | 0 | 0 | 0 |
| SATA2 | 0 | 1 | 0 | ⊓ | 0 | 0 |
| SATA3 | 0 | 0 | 1 | ⊓ | ⊓ | 0 |
FIG. 17

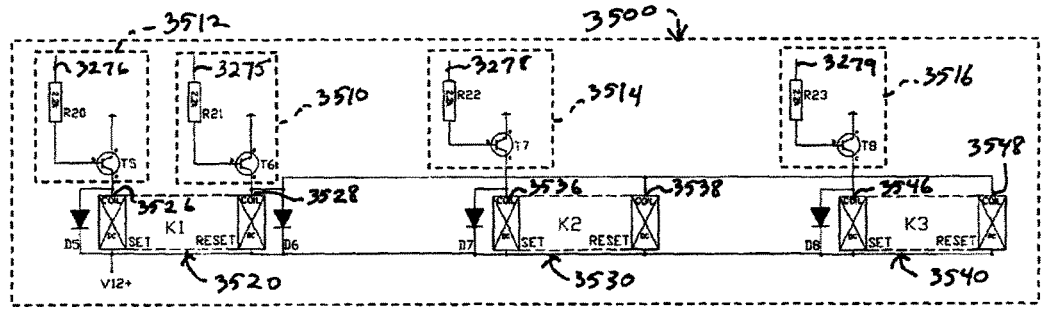
FIG. 20
FIG. 21
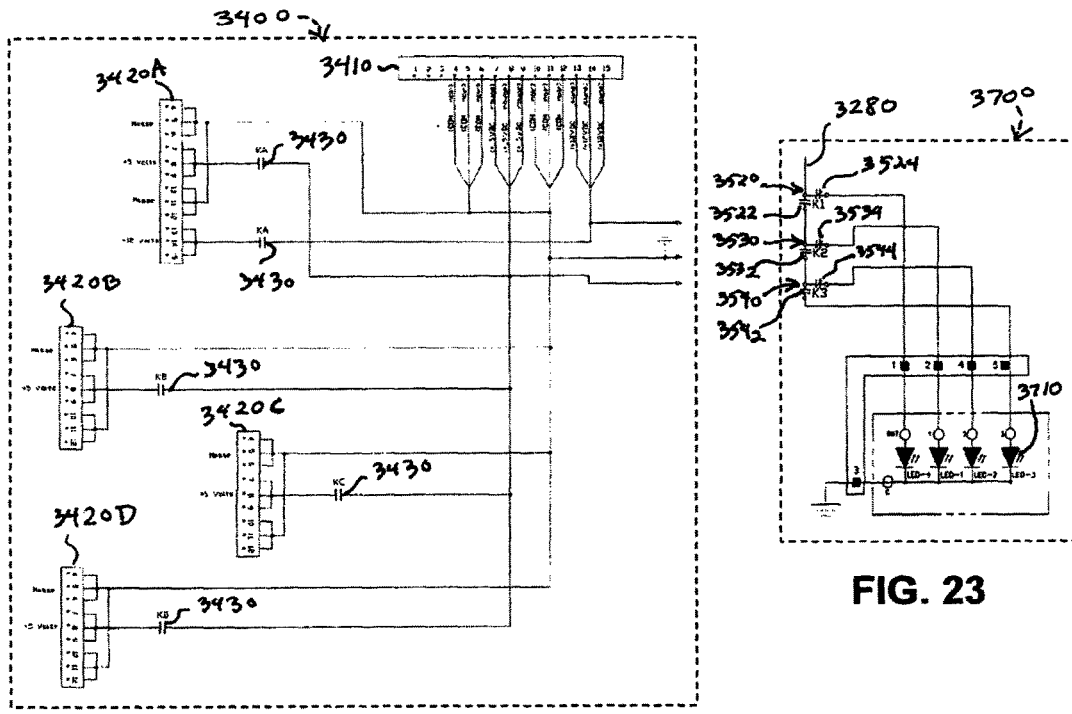
FIG. 22
FIG. 23

MASS STORAGE DEVICE SELECTOR

FIELD OF THE INVENTION

The present invention relates generally to computer device selectors and, more particularly, to a mass storage device selector operatively couplable between a host computer and a plurality of mass storage devices, for allowing a user of the host computer to securely and exclusively select, access and interface with only one of the mass storage devices operatively coupled thereto.

BACKGROUND

Mass storage device selectors are known in the art. These known mass storage device selectors are operatively couplable between a host computer and a plurality of mass storage devices such as, for examples, bootable or data hard disk drives (HDD), solid state drives (SSD), Blue-Ray, DVD or CD-ROM drives, or any other types of mass storage devices that can share data with a host computer through a standard IDE or SATA, among others, peripheral data port thereof.

In some instances of the prior art, the mass storage device selector is represented by a printed circuit board, or PC board, that can be installed in a free motherboard bus slot of a host computer. In other instances of the prior art, the mass storage device selector is represented by an external device of the host computer, and provided with suitable link cables coupled to power and/or data peripheral ports of the host computer.

In turn, these known PC boards and external devices are provided with multiple power and/or data port connectors to which can be operatively coupled a corresponding number of mass storage devices.

Typically, a custom software program associated with the mass storage device selector is loaded and installed in the memory of the host computer for allowing a user to select and access one of the mass storage devices operatively coupled to the host computer.

While these known mass storage device selectors of the prior art can generally fulfill the main objective of allowing a user to select and access one of the mass storage devices through a host computer, they generally entail one or more of the following disadvantages.

Data port selectors of the prior art generally represent complex assemblies and consume processing resources of the host computer. Thus, they are generally correspondingly costly to test and market.

They further generally require a software installation on the host computer, thus generally adding delays in the power up, or boot time, of the host computer, as well as representing an additional malware vulnerability for the host computer.

Furthermore, the known mass storage device selectors of the prior art generally channel data between the host computer and the mass storage devices through multiple stages of gated integrated circuits and thus, generally cannot guaranty the highest transfer rate rated for a given IDE or SATA data port. For example, a SATA data port revision III can reach up to a 6 Gb/s data transfer rate, and addition of additional components between the host computer and the mass storage device increases the likelihood that such a high data transfer rate will not be achievable. An additional factor of data transfer rate degradation resides in that the mass storage device selectors may allow the sharing of the maximum bandwidth performance among all the mass storage devices coupled therewith.

In some instances of these known mass storage device selectors of the prior art, selected data and/or control lines and signals from the motherboard of the host computer are necessarily used for completing a user selection of a mass storage, which significantly raises the complexity of implementation of such selectors.

In some other instances, a bootable mass storage device cannot be operatively coupled to the mass storage device selector, which significantly reduces their usefulness.

Furthermore, these mass storage device selectors may force a greater electrical consumption on the power resources of the host computer due to their necessity to periodically poll each mass storage device coupled therewith.

Against this background, there exists a need for an improved mass storage device selector operatively couplable between a host computer and a plurality of mass storage devices. An object of the present invention is to provide such an improved mass storage device selector.

SUMMARY OF THE INVENTION

In a broad aspect, the present invention provides a selector for selecting one selected mass storage device to interface with a computing device, the selected mass storage device being selected from a group of mass storage devices including a predetermined number of mass storage devices, the predetermined number being larger than one, the selector comprising: storage device ports in the predetermined number, each of the storage device ports being connectable to a respective one of the mass storage devices; a computing device port connectable to the computing device; a power input for powering the selector; a selection interface configurable in a selected selection interface configuration from a group of selection interface configurations, the selection interface configurations in the group being present in the predetermined number, each of the selection interface configurations corresponding to selection of a respective one of the storage device ports as a selected storage device port, the selected mass storage device being connectable to the selected storage device port; a connection module operatively coupled to the storage device ports, computing device port and selection interface for connecting the selected storage device port to the computing device port while disconnecting all other ones of the storage device ports from the computing device port when the selection interface is in the selected selection interface configuration; the connection module being configurable between a startup configuration and a steady state configuration, wherein in the startup configuration, the connection module is operative for determining the selected selection interface configuration and connecting the selected storage device port to the computing device port, and, in the steady state configuration, the connection module is irresponsive to the selection interface so that a previously selected storage device port remains connected to the computing device port irrespective of the selection interface configuration. The selected storage device port and the computing device port are connected to each other so that the selector becomes transparent for the computing device and the selected mass storage device appears to the computing device as being directly connected thereto so as to interface therewith.

The invention may provide a selector wherein the connection module is in the startup configuration for a predetermined period of time upon power being provided to the power input to power up the selector, the connection module automatically transitioning to the steady state configuration after a predetermined transition delay after being powered up.

The invention may provide a selector wherein the connection module remains in the steady state configuration unless electrical power is removed from the power input, at which point the connection module automatically resumes the startup configuration when next powered up.

The invention may provide a selector wherein the storage device and computing device ports are power ports for conveying electrical power from the computing device to the mass storage devices.

The invention may provide a selector wherein the storage device and computing device ports are data ports for conveying data signals between the computing device and the selected mass storage device.

The invention may provide a selector wherein the storage device and computing device ports are combined power and data ports for conveying both electrical power from the computing device to the selected mass storage device and data signals between the computing device and the selected mass storage device.

The invention may provide a selector wherein the data signals include electrical signals.

The invention may provide a selector wherein the data signals include optical signals.

The invention may provide a selector wherein the connection module includes switching elements in the predetermined number, each of the switching elements being provided between the computing device port and a respective one of the storage device ports, each of the switching elements being switchable between a closed configuration and an open configuration, wherein, in the open configuration, the computing device port and the respective one of the storage device ports are electrically disconnected from each other and in the closed configuration, the computing device port and the respective one of the storage device ports are electrically connected to each other by the switching element, the connection module being operative for configuring a selected switching element from the switching elements provided between the computing device port and the selected storage device port to the closed configuration and for configuring all other ones of the switching elements to the open configuration.

The invention may provide a selector wherein the switching elements each include a relay and a relay driver for selectively actuating the relay.

The invention may provide a selector wherein the computing device port includes at least two power supply lines providing the electrical power at different voltages, each of the storage device ports including at least two power receiving lines for each receiving the electrical power at a respective one of the voltages from the power supply lines.

The invention may provide a selector wherein the selection interface includes selection interface output ports in the predetermined number and a selection interface input port electrically connected to the power input, the selection interface output ports being each associated to a respective one of the selection interface configurations, a selected selection interface output port being electrically connected to the selection interface input port and all other ones of the selection interface output port being disconnected from the selection interface input port when the selection interface is configured in the selected selection interface configuration; the connection module including a selection circuit provided between the selection interface output ports and the switching elements, the selection circuit associating each of the selection interface output ports to a respective one of the switching elements and being operative to switch to the closed configuration the selected switching element associated with the selected selection interface output port when the connection module is in the startup configuration.

The invention may provide a selector wherein the selection circuit is a logic circuit.

The invention may provide a selector wherein the selection circuit includes latches in the predetermined number each provided between a respective one of the selection interface output ports and a respective one of the switching elements.

The invention may provide a selector wherein the latches each have a data input electrically connected to one of the selection interface output ports and a data output electrically connected to one of the switching elements, the switching elements being in the closed configuration when the data output connected thereto is in an active state and the switching elements being in the open configuration when the data output connected thereto is are an inactive state, the latches being configured such that when the connection module is in the startup configuration, only the latch connected to the selected selection interface output port has the data output thereof in the active state, all other ones of the latches having the data output thereof in the inactive state.

The invention may provide a selector wherein the connection module is configured so that in the steady state configuration, the data outputs of all of the latches are unable to change the data outputs between the active and inactive states.

The invention may provide a selector wherein the latches each have a clear input, the latches having the data output thereof in the inactive state when the clear input is activated.

The invention may provide a selector wherein the connection module includes a first timer providing a first predetermined delay, the first timer being operatively coupled to the clear input for activating the clear input after the first predetermined delay from when the selector is powered up.

The invention may provide a selector wherein the first timer includes a resistance/capacitor circuit provided between the clear inputs and the power input.

The invention may provide a selector wherein the latches each includes a clock input, the data output of the latches being able to change between the active and inactive states only when the clock input changes between two logic states; and the connection module includes a second timer providing a second predetermined delay larger than the first predetermined delay, the second timer being operatively coupled to the clock inputs for changing a logic state of the clock input on all of the latches after the second predetermined delay from when the selector is powered up, the second timer being operatively coupled to the clock inputs for maintaining constant the logic state of the clock inputs after the second predetermined delay, thereby configuring the connection module to the steady state configuration.

The invention may provide a selector wherein the second timer includes a resistance/capacitor circuit provided between the clock inputs and the power input.

The invention may provide a selector wherein the selection interface includes a manual switch for selectively electrically connecting only the selected selection interface output port to the selection interface input port.

The invention may provide a selector further comprising an indicator circuit operatively coupled to the connection module for indicating which one of the storage device ports is the selected storage device port.

The invention may provide a selector wherein the indicator circuit includes light emitting diodes (LED) in the predetermined number and each associated with a respective one of the storage device ports, the indicator circuit being operatively coupled to the connection module for lighting only the LED associated with the selected storage device port.

The invention may provide a selector wherein the connection module includes switching elements in the predetermined number less one connected to each other in a cascade, each of the switching elements including a switching element input port, first and second switching elements output ports, and a switching element control port, each of the switching elements being configurable in a first and a second configuration through the switching element control port, the switching element being operable for transmitting data from the switching element input port to respectively the switching element first and second output ports respectively in the switching element first and second configurations, the switching elements being connected to each other such that each of the switching elements has the switching element first output port thereof connected to a respective one of the storage device ports and the switching element second output port thereof connected to the switching element input port of a next one of the switching elements in the cascade, except for a last switching element in the cascade which has the switching element second output port thereof connected to a last one of the storage device ports, a first one of the switching elements in the cascade having the switching element input port thereof connected to the computing device port; in the startup configuration, the connection module is operative for switching to the switching element second configuration all of the switching elements between the switching element input port and the switching element connected to the selected storage device port and for switching to the first configuration the switching element connected to the selected storage device port, except when the selected storage device port is the last one of the storage device ports, in which case the last switching element is configured to the switching element second configuration.

The invention may provide a selector wherein the switching elements each include a normally open (NO) contact and a normally closed (NC) contact, the NO contact having NO contact input and output ports and the NC contact having NC contact input and output ports, the NO and NC contacts input ports being electrically connected to the switching element input ports and the NC and NO contacts output ports being electrically connected to respectively to the switching element first and second output ports, the NO and NC contacts being always together switched between open and closed states so that one and only one of the switching elements first and second output ports is electrically connected to the switching element input port at any time; and relay driver for selectively actuating the NO and NC contacts.

The invention may provide a selector wherein the computing device port includes at least two computing device data lines and each of the storage device ports including at least two storage device data lines for each exchanging electrical data signals with a respective one of the computing device data lines when connected thereto.

The invention may provide a selector wherein the connection module includes a memory circuit, the memory circuit including a memory circuit input port electrically connected to the selection interface for receiving therefrom selection interface input signals indicative of the selected selection interface configuration, a memory element for storing the selected selection interface configuration and a memory circuit output port for releasing memory signals indicative of the stored selected selection interface configuration; and a switching element actuation circuit including an actuation circuit input port electrically connected to the memory circuit output port for receiving the memory signals, actuation circuit output ports in the predetermined number less one each electrically coupled to the switching element control port of a respective one of the switching elements and a logic converter circuit provided between the memory circuit output port and the actuation circuit output ports for converting the memory signal to switching elements control signals released at the actuation circuit output ports, the switching elements control signals configuring the switching elements to the switching elements first and second configurations, to allow selection of the selected storage device port.

The invention may provide a selector wherein the memory circuit includes latches, the latches each having a data input electrically connected to the selection interface and a data output electrically connected to the switching element actuation circuit, the connection module being configured so that in the steady state configuration, the data outputs of all of the latches are unable to change data output logic state.

The invention may provide a selector wherein the latches each have a clear input, the latches having the data output thereof in an inactive state when the clear input is activated.

The invention may provide a selector wherein the connection module includes a first timer providing a first predetermined delay, the first timer being operatively coupled to the clear inputs for activating the clear inputs after the first predetermined delay from when the selector is powered up.

The invention may provide a selector wherein the first timer includes a resistance/capacitor circuit provided between the clear inputs and the power input.

The invention may provide a selector wherein the latches each includes a clock input, the data output logic state being able to change only when the clock input changes between two logic states; and the connection module includes a second timer providing a second predetermined delay larger than the first predetermined delay, the second timer being operatively coupled to the clock inputs for changing a logic state of the clock input on all of the latches after the second predetermined delay from when the selector is powered up, the second timer being operatively coupled to the clock inputs for maintaining constant the logic state of the clock inputs after the second predetermined delay, thereby configuring the connection module to the steady state configuration.

The invention may provide a selector wherein the second timer includes a resistance/capacitor circuit provided between the clock inputs and the power input.

The invention may provide a selector wherein the switching elements include latching relays, the connection module includes a third timer providing a third predetermined delay larger than the second predetermined delay, the third timer being operatively coupled to the switching element actuation circuit for allowing issuance of the switching element control signals thereby only from when the selector is first powered up to the third predetermined delay.

The invention may provide a selector wherein the third timer includes a resistance/capacitor circuit provided between the clock inputs and the power input.

The invention may provide a selector wherein the selection interface includes a manual switch.

The invention may provide a selector further comprising an indicator circuit operatively coupled to the connection module for indicating which one of the storage device ports is the selected storage device port.

The invention may provide a selector wherein the indicator circuit includes light emitting diodes (LED) in the predetermined number and each associated with a respective one of the storage device ports, the indicator circuit being operatively coupled to the connection module for lighting only the LED associated with the selected storage device port.

In another broad aspect, the invention provides a cascaded selector system, the cascaded selector system comprising a first selector and a second selector, the first and second selectors being as selector as hereinabove, the second selector having the computing device port thereof connected to one of the storage device port of the first selector.

In another broad aspect, the invention provides a computing device including a mass storage interface connected to the selector.

The invention may provide a selector system wherein the first selector includes a cascade of switching elements as defined hereinabove, the second selector having the computing device port thereof connected to the storage device port of the selector connected to a first one of the switching elements is the cascade.

An advantage of the selector of the present invention resides in that it may be advantageously used for securely and exclusively selecting one among a plurality of bootable mass storage devices, with each one loaded with a different operating system (OS) without any danger of perturbing the boot operation and subsequent use of the host computing device once the latter is turned on.

Furthermore, more than one selector may be operatively coupled in a cascaded configuration for allowing a user to securely and exclusively select and access one among a plurality of mass storage devices that is greater than the predetermined number of mass storage devices the selector can support.

Advantageously, the proposed selector is relatively easy to operate and install.

Another significant advantage of some embodiments of the selector, compared to known prior art selectors, resides in that it only requires sufficient power from the host computer to drive the relatively small coils of latching relays included in the selector, and only for about half a second following a power up of the host computer. For the rest of the time where the host computer is kept powered up, only minimal power is required to essentially power the IC's and the indicator circuit.

Furthermore, the general configuration of the selector requires an assembly comprising a relatively low number of standard electronic components to allow a user to exclusively select and access one among a plurality of mass storage devices and, thus, is relatively easy and economical to assemble, test commercialize.

Other objects, advantages and features of the present invention will become more apparent upon reading of the following non-restrictive description of some embodiments thereof, given by way of example only with reference to the accompanying drawings.

BRIEF DESCRIPTION OF THE DRAWINGS

FIG. 13, in a schematic diagram, illustrates a data relay circuit included in the mass storage device selector of FIG. 2;

FIG. 14, in a schematic diagram, illustrates a data router circuit included in the mass storage device selector of FIG. 2;

FIG. 15, in a schematic diagram, illustrates an assembly included in the mass storage device selector of FIG. 2, and comprising, in partial view, the second logic circuit, an indicator control circuit, and a selector indicator circuit;

FIG. 16, in a logic truth table form, illustrates logic states within a logic circuit second portion of the mass storage device selector of FIG. 2;

FIG. 17, in a logic truth table form, illustrates logic states within a data relay circuit, relative to the position of the selector switch, of the mass storage device selector of FIG. 2;

FIG. 20, in a schematic diagram, illustrates a data relay circuit included in the mass storage device selector of FIG. 3;

FIG. 21, in a logic truth table form, illustrates logic states within the relay circuit first portion, relative to the position of the selector switch, of the mass storage device selector of FIG. 3;

FIG. 22, in a schematic diagram, illustrates a power router circuit included in the mass storage device selector of FIG. 3;

FIG. 23, in a schematic diagram, illustrates an assembly included in the mass storage device selector of FIG. 3 and comprising, in partial view, the logic circuit second portion, and a selector indicator circuit;

DETAILED DESCRIPTION

Figure 1:
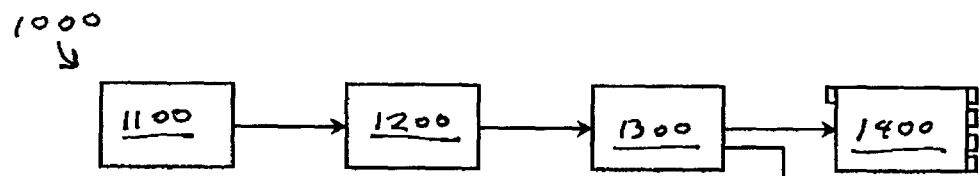
FIGS. 1, 2 and 3, in schematic views, illustrate a first, second and third embodiments respectively, of a mass storage device selector according to the present invention.

Generally speaking, the invention relates to a selector for selecting one selected mass storage device to interface with a computing device, the selected mass storage device being selected from a group of mass storage devices including a predetermined number of mass storage devices, the predetermined number being larger than one. For the purpose of this document, the terminology "interface" means that the computing device can read data from, and in some cases also write data to, the mass storage device. The mass storage device is any device that can store data thereon. Typically, the data is not erased once the mass storage device is turned off. The computing device is any device that may use the data to perform logical or arithmetic operations thereon. An example of such a computing device is a conventional general purpose computer. However, other devices are within the scope of the invention, as long as they need to access data from a mass storage device.

The selector includes ports, a selection interface and a connection module. A port is a means through which electricity or an optical signal can flow in or out of a component. Typically, the selector of the invention uses electrical ports. The port may take the form of a connector that allows attaching another compatibly shaped connector from another component. In other embodiments, a port includes simply a wire or even a printed circuit line on a printed circuit board, among other possibilities. The electricity that travels through a port may be electrical power, typically direct current but alternating currents being also within the scope of the invention, or data signals, typically digital signals that can take two discrete values. Data signals also include in some embodiments control signals that control the operation of another device. A port may include a single power or data line or more than one power or data line, and even combinations of power and data lines. A power line is a wire or group of wires carrying a current at a common electrical potential. Power lines used in the invention typically include a least two wires, one at a predetermined potential and the other one used as a ground. A data line is a wire or group of wires transmitting electrical signals.

The selector includes storage device ports in the predetermined number, each of the storage device ports being connectable to a respective one of the mass storage devices, a computing device port connectable to the computing device and a power input for powering the selector. In some embodiments, the power input is spliced from the computing device port, for example when the computing device port is a power port.

The selection interface is configurable in a selected selection interface configuration from a group of selection interface configurations, the selection interface configurations in the group being present in the predetermined number, each of the selection interface configurations corresponding to selection of a respective one of the storage device ports as a selected storage device port, the selected mass storage device being connectable to the selected storage device port.

The connection module is operatively coupled to the storage device ports, computing device port and selection interface for connecting the selected storage device port to the computing device port while disconnecting all other ones of the storage device ports from the computing device port when the selection interface is in the selected selection interface configuration. For the purpose of the present document, the terminology connecting means that the two components connected to each other can exchange electrical power, electrical signals or optical signals with each other. In the case of optical signals, the connection module includes optical switches, that may replace relays described hereinbelow.

The connection module is configurable between a startup configuration and a steady state configuration. In the startup configuration, the connection module is operative for determining the selected selection interface configuration, for example by receiving suitable signals from the selection interface, and connecting the selected storage device port to the computing device port, and, in the steady state configuration, the connection module is irresponsive to the selection interface so that a previously selected storage device port remains connected to the computing device port irrespective of the selection interface configuration. The selected storage device port and the computing device port are connected to each other so that the selector becomes transparent for the computing device and the selected mass storage device appears to the computing device as being directly connected thereto so as to interface therewith.

Typically, the connection module is in the startup configuration for a predetermined period of time upon power being provided to the power input to power up the selector, the connection module automatically transitioning to the steady state configuration after a predetermined transition delay after being powered up. Also typically, the connection module remains in the steady state configuration unless electrical power is removed from the power input, at which point the connection module automatically resumes the startup configuration when next powered up.

In some embodiments, the storage device and computing device ports are power ports for conveying electrical power from the computing device to the mass storage devices. In other embodiments, the storage device and computing device ports are data ports for conveying data signals between the computing device and the selected mass storage device. In yet other embodiments, the storage device and computing device ports are combined power and data ports.

FIGS. 1 and 4 to 10 inclusively show various aspects of a first embodiment of a mass storage device selector 1000, according to the present invention, hereinafter more simply referenced as the selector 1000.

Figure 8:
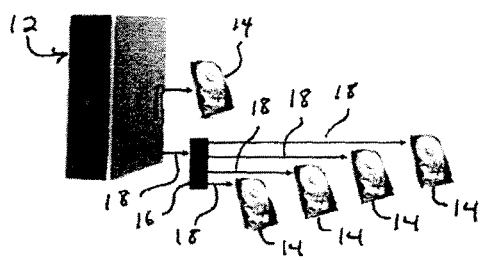
FIG. 8, in a perspective schematic view, illustrates the mass storage device selector of FIG. 1, here shown coupled between a host computer and four bootable mass storage device.

As illustrated in FIG. 8, the selector 1000 is typically operatively couplable between a female peripheral power connector of a computing device in the form of a host computer 12 and a male power connector of at least two mass storage devices 14. The mass storage devices 14 may be represented, for example, by a same type, or a combination of, bootable and/or data storage hard disk drives (HDD), solid state drives (SSD), Blue-Ray, DVD or CD-ROM drives or any other types of mass storage devices that can be powered by, and share data with, a host computer 12 through standard power and communication ports.

It will be apparent from the following detailed description that the present invention may be used to operatively couple to a host computer 12 not only mass storage devices 14 but, more broadly, any types of peripheral devices that can be powered by, and share data with, a host computer 12 through standard power and communication ports.

The selector 1000 is usable for allowing a user of the host computer 12 to securely and exclusively select and access only one of the mass storage devices 14 thus operatively coupled to the host computer 12 through the selector 1000 to interface therewith.

In the following description, the selector 1000 will be exemplified as allowing a user of the host computer 12 to securely and exclusively select and access directly one among four (4) mass storage devices 14, but other numbers of mass storage devices are within the scope of the invention.

With reference to FIG. 1, the selector 1000 comprises a selection interface in the form of a selector switch 1100, a logic circuit 1200 having input terminals electrically coupled to selected output terminals of the selector switch 1100, a power relay circuit 1300 having input terminals electrically coupled to selected output terminals of the logic circuit 1200, and a power router circuit 1400 having input terminals electrically coupled to selected output terminals of the power relay circuit 1300. The logic circuit 1200, power relay circuit 1300 and power router circuit 1400 form a connection module.

In some embodiments, the selector 1000 may further comprise an indicator circuit 1700 having input terminals electrically coupled to selected output terminals of the power relay circuit 1300.

In a specific and non-limiting embodiment of the invention, the various circuits above are powered by a +12 VDC supply terminal, a first and second reference ground terminal, and a +5 VDC supply terminal of the selector 1000, which together provide the power input and the computing device port, which is therefore in this case a power port. As it will be described further below, these voltage supplies and reference ground terminals of the selector 1000 are provided through a peripheral power connector of the host computer 12 to which is operatively coupled the selector 1000.

Figure 4:
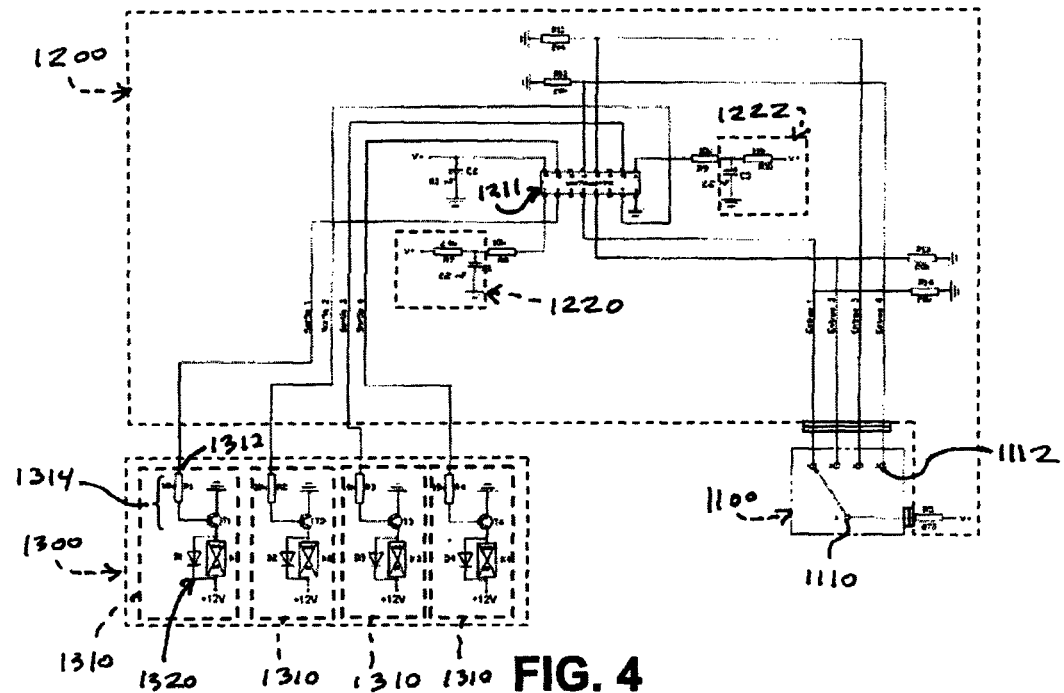
FIG. 4, in a schematic diagram, illustrates an assembly included in the mass storage device selector of FIG. 1, and comprising a selector switch, a logic circuit and a power relay circuit.

With reference to FIG. 4, the selector switch 1100 may be typically represented by a commercially available single pole, 4-way manual rotary switch having a selector switch input terminal 1110, acting as a selection interface input port and four (4) selector switch output terminals 1112, acting as selection interface output ports. Other equivalent manual switch may be used.

The selector switch input terminal 1110 is electrically coupled to the +5 VDC supply terminal of the selector 1000, or in other words to the power input. Each position of the selector switch 1100 results an electrical connection between only one of the selection interface output ports and the selection interface input port.

In other embodiments of the selector 1000, the selector switch 1100 may be represented by a commercially available remote controlled selector switch (not shown in the drawings) controllable through a remote control device using a network link such as, for example, a wired Ethernet link, a Wi-Fi link, a Bluetooth link, a cellular network link, or the likes.

Thus, the selector switch 1100 provides a means for manually selecting which one of the mass storage devices 14 coupled to the selector 1000 will be exclusively powered through a peripheral power port of the host computer 12. The selection interface output ports are therefore each associated to a respective one of the selection interface configurations, each selection interface configuration in the present case being a position of the selector switch 1100.

Figure 6:
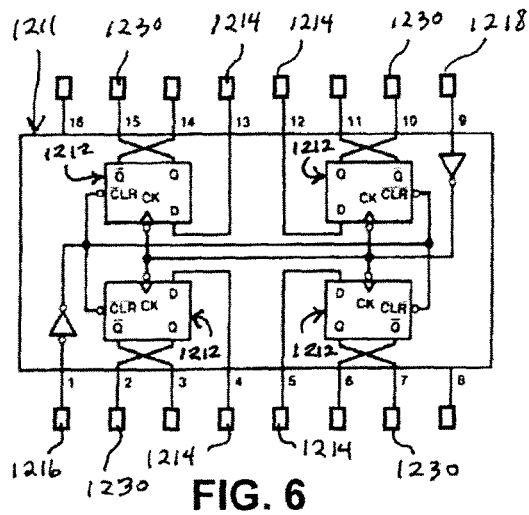
FIG. 6, in a schematic diagram, illustrates the internal logic elements of a conventional MM74HC175 D-Type Quad Flip-Flop integrated circuit (IC)

Now referring more particularly to FIGS. 4 and 6, the logic circuit 1200 includes a logic gate circuit 1211 in the form of a D-Type Quad Flip-Flop integrated circuit (IC). For example, the logic gate circuit 1211 may represented by the well-known 16-pin high speed CMOS MM74HC175 IC manufactured by Fairchild Semiconductor™, or any equivalent logic IC or combination of logic IC's. Also, while D-Type Flip-Flops are used in the presently described embodiment of the invention, any other type of circuit including latches of a suitable type are usable in alternative embodiments. Typically, the number of latches is the same as the number of storage device ports. The logic circuit 1200 acts as a selection circuit provided between the selection interface output ports and switching elements, described in further details hereinbelow, the selection circuit associating each of the selection interface output ports to a respective one of the switching elements and being operative to switch to a closed configuration the selected switching element associated with the selected selection interface output port when the connection module is in the startup configuration.

As seen in FIG. 6, each one of the four latching D-type Flip-Flop circuits 1212 of the logic gate circuit 1211 has its D-input 1214, also referred to as a data input, electrically connected to a respective one of the four selector switch output terminals 1112, its common Clear-input 1216 electrically coupled to a first delay timer circuit 1220, and its common Clock-input 1218 electrically coupled to a second delay timer circuit 1222. Ultimately, each D-type Flip-Flop circuits 1212 connects to a respective switching element, as detailed hereinbelow.

The first delay timer circuit 1220, providing a first predetermined delay, is represented by a conventional resistor-capacitor, or RC timer circuit between the power input and the components to which the first delay timer circuit 1220 is connected and suitably configured so as to delay the detection of a logic LOW to HIGH state transition at the common Clear-input 1216 for a time period included for example in an interval of between zero (0) and roughly ten (10) milliseconds following a +5 VDC power up of the logic circuit 1200. For example, the first delay timer circuit 1220 includes a 2.4K ohms resistor and a 2.2 microfarads capacitor so as to delay the LOW to HIGH state transition at the common Clear-input 1216 for a time period of about seven and a half (7.5) milliseconds following a +5 VDC power up of the logic circuit 1200. Other types of timers and other values of the first predetermined delay are within the scope of the present invention.

The second delay timer circuit 1222 provides a second predetermined delay, larger than the first predetermined delay, and is also represented by a conventional resistor-capacitor, or RC timer circuit between the power input and the components to which the second delay timer circuit 1222 is connected to and suitably configured so as to delay the detection of a logic LOW to HIGH state transition at the common Clock-input 1218 for a time period that is at least relatively greater than the first predetermined delay. Typically, the second delay timer circuit 1222 has a second predetermined delay between the first predetermined delay and roughly fifty (50) milliseconds following a +5 VDC power up of the logic circuit 1200. For example, the second delay timer circuit 1222 includes a 10K ohms resistor and a 2.2 microfarads capacitor so as to delay the LOW to HIGH state transition at the common Clock-input 1218 for a time period of about thirty (30) milliseconds following a +5 VDC power up of the logic circuit 1200. Again, other types of timers and other values of the second predetermined delay are within the scope of the present invention.

Other equivalent resistor and capacitor values, as well as types and configurations of delay timer circuits are also possible for the first and second delay timer circuits 1220 and 1222 respectively, so as to respect the relative values of time delays therebetween, as described in the preceding paragraph.

Thus, as would be apparent for someone familiar with latching D-type Flip-Flop IC's, with the logic circuit 1200 in a non-powered state and the selector switch 1100 at a user selected position, following a +5 VDC power up thereof, all Q-outputs 1230, also referred to as data output, are kept at a logic LOW state for the duration of the 7.5 milliseconds delay applied by the first delay timer circuit 1220, so as to let sufficient time for the logic gate circuit 1211 and selected D-input 1214 to be stably powered up at +5 VDC.

Next, at about the end of the 30 milliseconds delay value applied by the second delay timer circuit 1222 following a +5 VDC power up, at which moment the logic gate circuit 1211 detects a logic LOW to HIGH state transition at the common Clock-input 1218, the logic HIGH state, thus already stably present at the selected D-input 1214, is exclusively copied at the corresponding Q-output 1230 of the same latching D-type Flip-Flop circuit 1212.

Hence, the corresponding Q-output 1230 is the exclusive one of the four Q-outputs 1230 that is logically latched at a logic HIGH state invariably of any subsequent change of logic state at any one of the four D-inputs 1214, or equivalently, at any subsequent position of the selector switch 1100, and as long as the logic gate circuit 1211 is not powered down. Therefore, the selection module is in the startup configuration until expiration of the second predetermined delay, and transitions to the steady state configuration at the end of the second predetermined delay.

Thus, the logic circuit 1200 provides a means for latching a HIGH logic state corresponding to the active selector switch input terminal at power up of the host computer 12, and until the latter turned off. It should be noted that the particular case of a HIGH logic state as an active state, and therefore a LOW logic state as an inactive state, is used for example purposes. In alternative embodiments, it is possible to have a LOW logic state as an active state and a HIGH logic state as an inactive state. The Q-output 1230, or data output, is electrically connected to a respective one the switching elements. Each switching element is in a closed configuration when the data output connected thereto is in an active state and the switching element is in an open configuration when the data output connected thereto is in an inactive state.

Referring to FIG. 4, the power relay circuit 1300 includes four (4) relay driver circuits 1310, once for each power relay 1320 described hereinbelow. Each one of the four relay driver circuits 1310 includes a relay driver input terminal 1312 electrically coupled to a respective one of the four Q-output 1230 of the logic gate circuit 1211, a transistor circuit 1314 having an input electrically coupled to the relay driver input terminal 1312, a power relay 1320 having one end of its coil electrically coupled to an output of the transistor circuit 1314 and the other end of its coil coupled to the +12 VDC supply terminal of the selector 1000. A power relay 1320 is provided for each storage device port.

Each one of the four transistor circuits 1314 includes suitable circuit means for converting the relatively low power logic +5 VDC signal that may be present at a Q-output 1230 into sufficient voltage and current levels for driving, or actuating, the power relay 1320, to change its state. For example, as would be obvious to someone familiar with known relay driver circuits, each transistor circuit 1314 may be represented by a combination of a suitably sized and configured current limiting resistor at the gate input of a NPN transistor for establishing an electrical contact between the coil of the power relay 1320 and the first reference ground terminal of the selector 1000.

The power relay 1320 may be represented for example by a commercially available and relatively small +12 VDC electromechanical relay provided with at least two (2) normally open (N.O.) contacts, which use will be described hereinafter.

Thus, the power relay circuit 1300 provides a means for activating a power relay 1320 corresponding to the latched HIGH logic state provided by the logic circuit 1200. Together, each relay driver circuits 1310 and the power relay 1320 connected thereto form a switching element. Generally speaking, each of the switching elements is provided between the computing device port and a respective one of the storage device ports and is switchable between a closed configuration and an open configuration. In the open configuration, the computing device port and the respective one of the storage device ports are electrically disconnected from each other and in the closed configuration, the computing device port and the respective one of the storage device ports are electrically connected to each other by the switching element. The connection module is operative for configuring a selected switching element from the switching elements provided between the computing device port and the selected storage device port to the closed configuration and for configuring all other ones of the switching elements to the open configuration. In alternative embodiments, the switching element may be represented by a solid state switching element.

Figure 5:
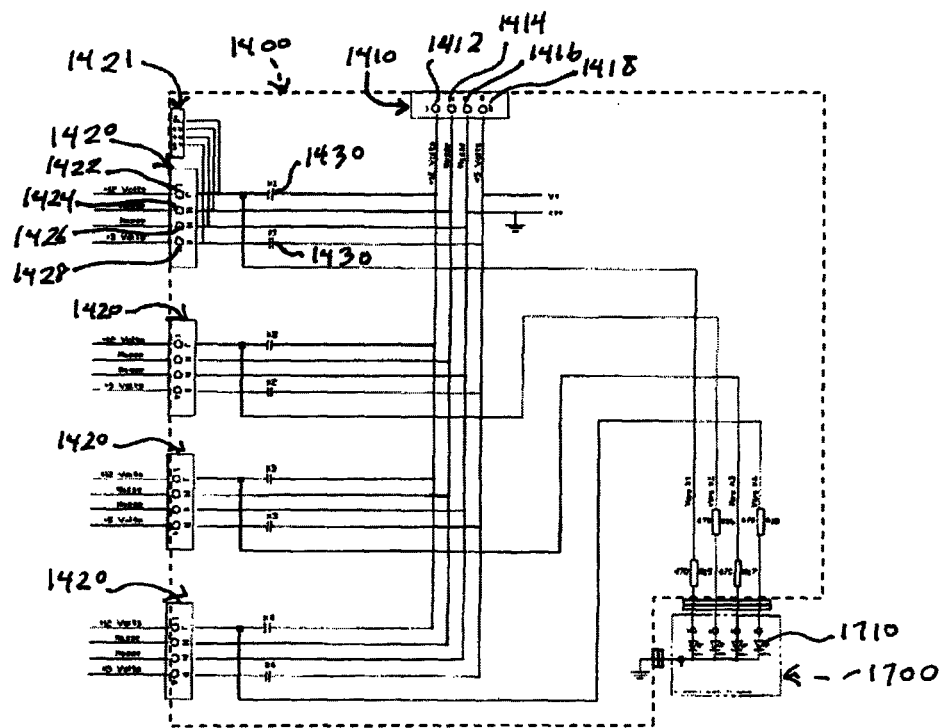
FIG. 5, in a schematic diagram, illustrates an assembly included in the mass storage device selector of FIG. 1, and comprising a power router circuit and a selector indicator circuit.

With reference to FIG. 5, the power router circuit 1400 includes a power input connector 1410, acting as the computing device port. The power input connector 1410 includes a +12 VDC input terminal 1412, a first reference ground input terminal 1414, a second reference ground input terminal 1416 and a +5 VDC input terminal 1418.

The power input connector 1410 is for example represented by a standard 4-pin POWER MOLEX male connector. Alternatively, the power input connector 1410 may be represented by a standard 4-pin POWER SATA male connector. Other formats of a power input connector 1410 are also possible.

The male power input connector 1410 is for connecting with a compatible peripheral female power connector typically available on the host computer 12.

The +12 VDC supply terminal and its associated first reference ground terminal, and the +5 VDC supply terminal and its associated second reference ground terminal, used in the detailed description of the selector 1000 above, are derived from suitable connections with the corresponding terminals of the power input connector 1410. Thus, the voltage sources and reference grounds of the selector 1000 are provided by the host computer 12. However, it is within the scope of the invention to provide power to the selector

1000 in any other suitable manner, for example through a dedicated power supply or through a battery.

The power router circuit 1400 further includes four (4) power output connectors 1420, each acting as a storage device port. In a similar fashion as for the power input connector 1410, each one of the four power output connectors 1420 includes a +12 VDC output terminal 1422, a first ground output terminal 1424, a second ground output terminal 1426 and a +5 VDC output terminal 1428.

Each one of the output terminals 1422, 1424, 1426 and 1428 of each one of the four power output connectors 1420 is electrically coupled to the corresponding input terminal 1412, 1414, 1416 and 1418 respectively, of the power input connector 1410. Thus, the four power output connectors 1420 are electrically coupled in parallel to the power input connector 1410.

Furthermore, each +12 VDC output terminal 1422 and +5 VDC output terminal 1428 of a same power output connector 1420 is electrically coupled to its corresponding +12 VDC input terminal 1412 and +5 VDC input terminal of the power input connector 1410 through an individual one of the two normally open contacts 1430 of a same power relay 1320 of the power relay circuit 1300. Thus, each +12 VDC and +5 VDC output terminals 1422 and 1428 in a same power output connector 1420 are controlled through a same power relay 1320.

In a similar fashion as for the power input connector 1410, each one of the four power output connectors 1420 is typically represented by a standard 4-pin POWER MOLEX female connector. Alternatively, each one of the power output connectors 1420 may be represented by a standard 4-pin POWER SATA female connector.

Furthermore, in some embodiments of the selector 1000, the power router circuit 1400 may include a suitable mix of both types of standard connectors.

Still furthermore, in some embodiments of the selector 1000, as illustrated in FIG. 5, one or more of the power output connectors 1420 may be represented by both a standard 4-pin POWER MOLEX female connector and a standard 4-pin POWER SATA female connector 1421 that are electrically paired in parallel for an enhanced compatibility with various mass storage devices and other computer peripheral devices in general.

Thus, the power router circuit 1400 provides a means for establishing an exclusive hard wired connection between the power input connector 1410 and the power output connector 1420 to which is electrically coupled the user selected mass storage device 14, based on the activated power relay 1320 of the power relay circuit 1300.

The indicator circuit 1700 is operatively coupled to the connection module for indicating which one of the storage device ports is the selected storage device port. For example the indicator circuit includes four light emitting diodes (LED's) 1710, one for each position of the manual switch. Each one of the four LED's 1710 has its anode electrically coupled to the second ground reference terminal of the selector 1000, and its cathode to the +5 VDC output terminal 1428 of a corresponding one of the power output connectors 1420, through a current limiting resistor. Thus, when the two normally open contacts 1430 of a selected one of the power output connectors 1420 are closed, the LED 1710 of the indicator circuit 1700 that is associated with the selected power output connector 1420 is energized for indicating that the latter is actively powered with +12 VDC and +5 VDC voltages and reference grounds.

Other equivalent means of indicating the presence of electrical power on each power output connectors 1420 are also possible.

Thus, the indicator circuit 1700 provides a means for visually confirming to the user which one of the power output ports of the selector 1000 is actively providing power to a mass storage device 14 coupled thereto.

A method of operation of the selector 1000 will now be described. In a first step, with the host computer 12 in a turned off state, the selector 1000 is suitably operatively coupled between the host computer 12 and a plurality of mass storage devices 14, and the selector switch 1100 is in a user selected position corresponding to a desired mass storage device 12 to be securely and exclusively accessed. In a second step, the host computer 12 is powered up and, following the delay applied by the second delay timer circuit 1222, the selected mass storage device 14 is energized, along with LED 1710 associated with the corresponding power output connector 1420.

Furthermore, from that moment on until the host computer 12 is turned off, any subsequent repositioning of the selector switch 1100 has no effect on the operation of the selector 1000 and the actively selected mass storage device 14.

Figure 7:
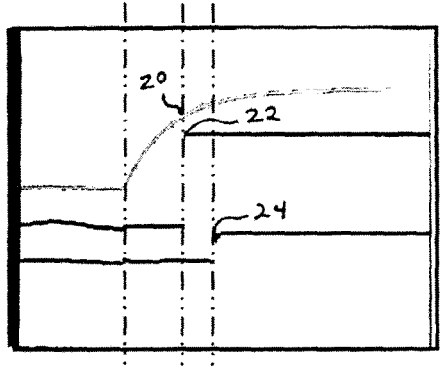
FIG. 7, in a graphic view, comparatively illustrates timed voltage signals at selected voltage test points of the mass storage device selector of FIG. 1.

With reference to FIG. 7, there is illustrated in a graphic form and in a relative time sequence, three voltage readings 20, 22 and 24 measured respectively at the common Clear-input 1216, as delayed by the first delay timer circuit 1220, the subsequent Q-output 1230, as delayed by the second delay timer circuit 1222 applied to the common Clock-input 1218 and, finally, the resulting voltage present at the +5 VDC output terminal 1428 of the selected power output connector 1420.

Thus, the selector 1000 may be advantageously used for securely and exclusively selecting one among a plurality of bootable mass storage devices 14, with each one loaded with a different operating system (OS), without any danger of perturbing the boot operation and subsequent use of the host computer 12 once the latter is turned on.

As it would be apparent to someone familiar with known electronic router circuits, the selector 1000 may be substantially easily scaled up in terms of selectable power connectors using additional standard components assembled in a similar fashion as the ones described above, to directly select and access less than four, or more than four, mass storage devices 14.

Figure 9:
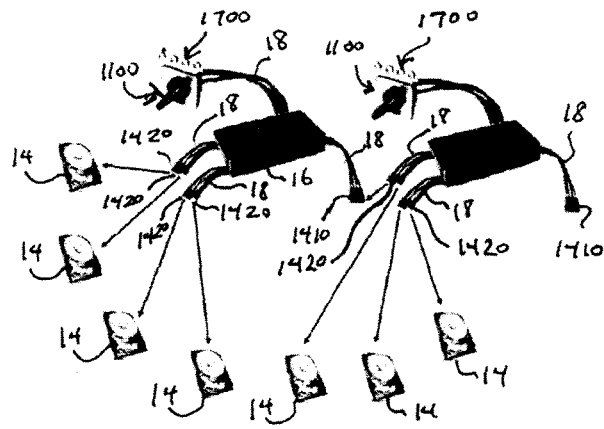
FIG. 9, in a perspective exploded view, illustrates two mass storage device selectors such as the one in FIG. 1, here shown operatively coupled in series for providing a cascaded network of seven mass storage devices that are each user exclusively selectable.
Figure 10:
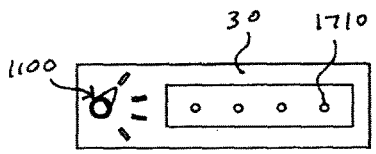
FIG. 10, in a front elevational view, illustrates an exemplary embodiment of a selector switch and an indicator circuit, here shown both integrated in a modular front computer bezel.

It would also be apparent that, consequently of its relatively simple assembly using largely available standard electronic components, the selector 1000 may be conventionally and economically packaged and sold as any other off-the-shelf computer peripheral device. For example, as illustrated in FIGS. 8 and 9, the selector 1000 may be packaged in a standard 3.5 inches housing 16 provided with suitable extension cables 18 between the housing 16 and the selector switch 1100, the indicator circuit 1700, and the power input and output connectors 1410 and 1420 respectively. The selector switch 1100 and indicator circuit 1700 may be further integrated in a standard computer front bezel 30, as illustrated in FIG. 10. Alternatively, the selector 1000 may be factory integrated directly into the manufactured hardware of a host computer 12.

Furthermore, as illustrated in FIG. 9, more than one selector 1000, as described in the example above, may be operatively coupled in a cascaded configuration, power output connectors 1420 electrically coupled to the power input connector 1410 of a corresponding mass storage device 14, and its fourth power output connector 1420 serving as a peripheral power output connector for a second selector 1000, and so on. Thus, as illustrated in the figure, by suitably positioning the selector switch 1100 of each one of the two selectors 1000 assembled in a cascaded mode, one among up to seven user selected mass storage device 14 may be securely and exclusively accessed among all the other mass storage devices 14 operatively coupled therewith. Furthermore, more than one selector 1000 may have its power input connector 1410 electrically coupled to power output connectors 1420 of a same selector 1000 for allowing a user to securely and exclusively select and access one among a plurality of mass storage devices 14 that is greater than four.

In such a configuration, or "cascade mode", a first selector 1000 has its power input connector 1410 electrically coupled to a peripheral power output connector of the host computer 12, three of its power output connectors 1420 electrically coupled to the power input connector of a corresponding mass storage device 14, and its fourth power output connector 1420 serving as a peripheral power output connector for a second selector 1000, and so on. Thus, by suitably positioning the selector switch 1100 of each one of the two selectors 1000 assembled in a cascaded mode, one among up to seven user selected mass storage devices 14 may be securely and exclusively accessed among all the other mass storage devices 14 operatively coupled therewith. Furthermore, more than one selector 1000 may have its power input connector 1410 electrically coupled to the power output connectors 1420 of a same selector 1000 for for allowing a user to securely and exclusively select and access one among a plurality of mass storage devices 14 that is greater than four.

FIGS. 2 and 11 to 16 inclusively show various aspects of a second embodiment of a mass storage device selector 2000, according to the present invention, hereinafter more simply referenced as the selector 2000. The selector 2000 is similar to the selector 1000 and all the variations possible to the selector 1000 mentioned hereinabove can also be implemented in the selector 1000 unless otherwise mentioned or obviously incompatible with the selector 2000. Also, the way in which the selector 2000 operates is similar to the way in which the selector 1000 operates and details of operations that were mentioned hereinabove for the selector 1000 that also apply to the selector 2000 are not necessarily repeated hereinbelow.

Likewise the selector 1000 described previously, the selector 2000 is typically operatively couplable between a host computer 12 and a plurality of mass storage devices 14. The selector 2000 is thus usable for allowing a user to securely and exclusively select and access only one of the mass storage devices 14 thus operatively coupled to the host computer 12 through the selector 2000.

As it will be described in details further below, the main difference of the selector 2000, relative to the selector 1000, essentially resides in that it is the data lines instead of the power lines that are routed through the selector 2000, between the host computer 12 and exclusively one of the mass storage devices 14 selected by the user.

In the following description, the selector 2000 will be exemplified as allowing a user of the host computer 12 to exclusively select one among up to three (3) mass storage devices 14. Furthermore, the data lines routed through the selector 2000 are SATA data port lines of SATA compatible mass storage devices 14.

In a similar fashion as for the selector 1000, the various electronic elements of the selector 2000 described hereinafter are powered by a +12 VDC, a +5 VDC and two reference grounds associated with each one of these voltage sources respectively. These voltages sources and reference grounds are provided through a suitable power cable (not shown in the drawings) forming a power input and having one end electrically coupled to suitable power terminals of the selector 2000, and the other end thereof provided with a standard MOLEX or Power SATA male connector that is removably coupled to a standard female peripheral power connector of the host computer 12 to which it is operatively coupled.

Figure 2:
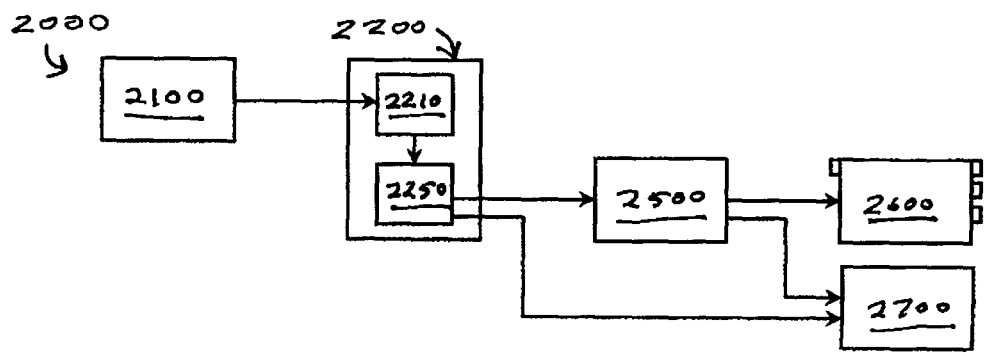

Referring more particularly to FIG. 2, the selector 2000 is substantially similar to the selector 1000 in that, likewise the latter, the selector 2000 comprises a selector switch 2100, a logic circuit 2200 having input terminals electrically coupled to selected output terminals of the selector switch 2100, a data relay circuit 2500 having input terminals electrically coupled to selected output terminals of the logic circuit 2200, and a data router circuit 2600 having input terminals electrically coupled to selected output terminals of the data relay circuit 2500. The logic circuit 2200, data relay circuit 2500 and data router circuit 2600 form a connection module.

In some embodiments, the selector 2000 may further comprise an indicator circuit 2700 having input terminals electrically coupled to selected output terminals of the data relay circuit 2500.

The various circuits above are powered by a +12 VDC supply terminal, a first and second reference ground terminal, and a +5 VDC supply terminal of the selector 2000. As it will be described further below, these voltages and reference grounds of the selector 2000 are provided through a peripheral power connector of the host computer 12 to which is electrically coupled the selector 2000.

Figure 11:
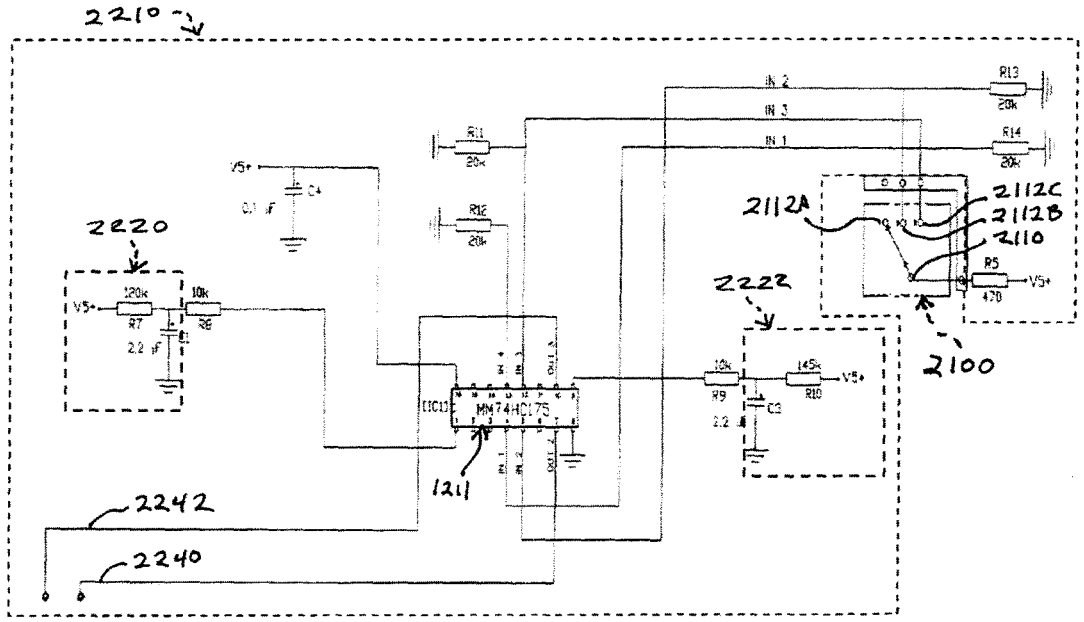
FIG. 11, in a schematic diagram, illustrates an assembly included in the mass storage device selector of FIG. 2, and comprising a selector switch and a logic circuit first portion.

With reference to FIG. 11, the selector switch 2100, which forms the selection interface, may be typically represented by a commercially available single pole, 3-way manual rotary switch having a selector switch input terminal 2110 and three (3) selector switch output terminals, namely selector switch output first, second and third terminals, 2112A 2112B and 2112C respectively. The selector switch input terminal 2110 is electrically coupled to the +5 VDC supply terminal of the selector 2000. Other types of equivalent selector switches are also possible, and selector switches having any other suitable number of switch output terminals, one for each mass storage device to select, are within the scope of the invention.

The selector switch 2100 provides a means for manually selecting which one of the mass storage devices 14 coupled to the selector 2000 will be in an exclusive data communication with the host computer 12 through a data port thereof.

As illustrated in FIG. 2, the logic circuit 2200 includes a logic circuit first portion 2210, acting as a memory circuit and a logic circuit second portion 2250, acting as a switching element actuation circuit.

Now referring more particularly to FIG. 11, the logic circuit first portion 2210 is substantially similar to the logic circuit 1200 of selector 1000 (seen in FIG. 6) in that it includes a logic gate circuit 1211 in the form of a D-Type Quad Flip-Flop integrated circuit (IC), such as the MM74HC175, or an equivalent circuit, a first delay timer circuit 2220, and a second delay timer circuit 2222.

Unlike selector 1000 though, only two (2) of the four (4) latching D-type Flip-Flop circuits 1212 of the logic gate circuit 1211 are used. The D-type Flip-Flop circuits 1212 form a memory element for storing the selected selection interface configuration. It should be understood that in alternative embodiments of the invention, the selected selection interface configuration is stored in any other suitable manner.

Thus, each one of the two (2) D-type Flip-Flop circuits 1212 has its D-input 1214 electrically connected to a respective one of two selector switch output terminals, namely selector switch output second terminal 2112B and selector switch output third terminal 2112C, through a memory circuit input port that is in this case simply electrical lines extending between the D-type Flip-Flop circuits 1212 and the selector switch output second and third terminals 2112B and 2112C. The first of the three positions of the selector switch terminals, namely selector switch output first terminal 2112A, is left unconnected, or open. The current that may be transmitted through the selector switch output second terminal 2112B and selector switch output third terminal 2112C defines a selection interface input signals indicative of the selected selection interface configuration As it will be made apparent through the description of the logic circuit second portion 2250 hereinafter, only two (2) D-type Flip-Flop circuits 1212 are required for allowing a user to exclusively select one among up to three mass storage devices 14 operatively coupled to the selector 2000, by using the three position selector switch 2100.

Each one of the two (2) D-type Flip-Flop circuits 1212 further has its common Clear-input 1216 electrically coupled to the first delay timer circuit 2220, and its common Clock-input 1218 electrically coupled to the second delay timer circuit 2222.

First and second delay timer circuits 2220 and 2222 may be represented by conventional RC delay timer circuits configured so as to apply a delay of about 250 ms and 280 ms respectively, for example. Thus, there is an intermediate time delay difference of about 30 ms between both delay timer circuits 2220 and 2222. It is to be noted that first and second delay timer circuits 2220 and 2222 each have the same function as their corresponding first and second delay timer circuits 1220 and 1222 of the selector 1000, yet, are each having a respectively relatively greater predetermined delay so as to allow greater time safety margins during the power up of the selector 2000. It is to be noted that, in a similar fashion as with the two timers of selector 1000, the predetermined time delay value of the second delay timer circuit 2222 is at least relatively greater than the predetermined time delay value of the first delay timer circuit 2220.

Furthermore, the logic circuit first portion 2210 includes a logic circuit first portion first and second outputs 2240 and 2242, forming a memory circuit output port for releasing memory signals indicative of the stored selected selection interface configuration, which are electrically coupled to a respective one of the Q-outputs 1230 which, in turn, are operatively coupled to a respective one of the selector switch second and third terminals 2112B and 2112C, through a respective D-type Flip-Flop circuits 1212.

Thus, the initial logic state of each one of the selector switch second and third terminals 2112B and 2112C, as registered by the logic circuit first portion 2210 on power up of the selector 2000, are permanently latched on the logic circuit first portion first and second outputs 2240 and 2242 respectively, for as long as the host computer 12 is powered.

The logic circuit second portion 2250 converts the latched outputs of the logic circuit first portion 2210 described above, into suitable set and reset impulse control signals for a pair of latching relays of the data relay circuit 2500, which will be described further below.

Figure 12:
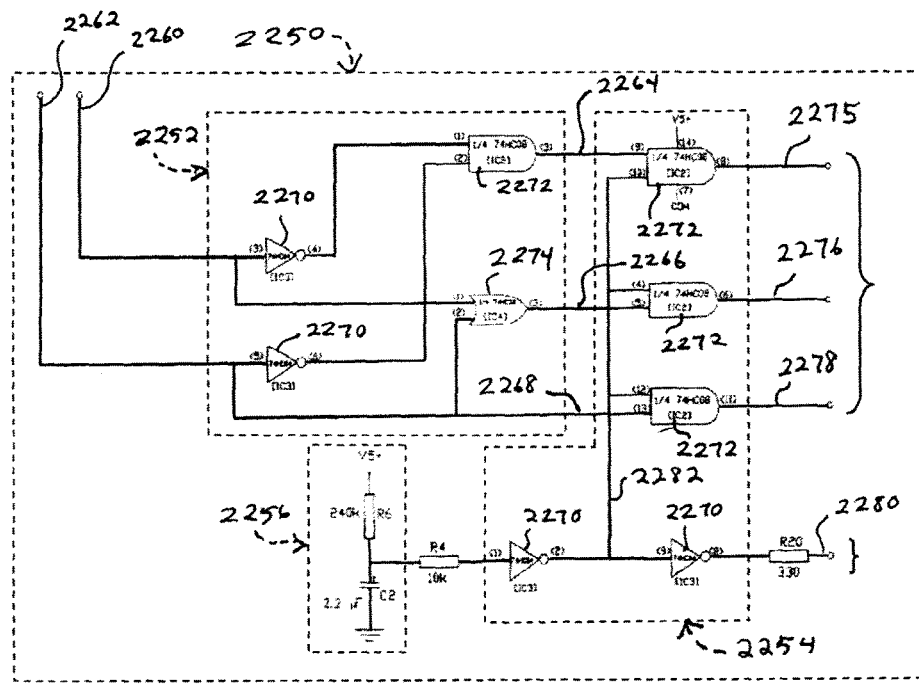
FIG. 12, in a schematic diagram, illustrates a logic circuit second portion included in the mass storage device selector of FIG. 2.

Referring to FIG. 12, the logic circuit second portion 2250 includes a logic converter circuit 2252, a logic pulse circuit 2254 and a third delay timer circuit 2256.

The logic converter circuit 2252 includes logic converter first and second inputs 2260 and 2262 that are electrically coupled to logic circuit first portion first and second outputs 2240 and 2242 respectively. The logic converter first and second inputs 2260 and 2262 form an actuation circuit input port electrically connected to the memory circuit output port for receiving the memory signals. The logic converter circuit 2252 further includes logic converter first, second and third outputs 2264, 2266 and 2268 that are operatively coupled to the first and second inputs 2260 and 2262 through a suitable assembly of NOT 2270, AND 2272 and OR 2274 logic gates there between. This assembly of logic gates is configured so as to convert the three possible combinations of logic states at the inputs 2260 and 2262, into the logic states indicated in the first truth table in FIG. 16, for the outputs 2264, 2266 and 2268 respectively.

The logic pulse circuit 2254 transfers the HIGH or LOW logic state present at each one of the logic converter first, second and third outputs 2264, 2266 and 2268, to a corresponding one of a logic pulse circuit first, second and third outputs 2274, 2276 and 2278 respectively, through one input of a respective one of a preferably 2-inputs AND logic gate 2272 of the logic pulse circuit 2254.

The other input of each AND logic gate 2272 are all electrically coupled to a common trigger circuit input 2282 which, in turn, is operatively coupled to the output of the third delay timer circuit 2256 through a NOT logic gate 2270 of the logic pulse circuit 2254.

Likewise the first and second delay timer circuits 2220 and 2222, the third delay timer circuit 2256 is preferably represented by a conventional RC timer circuit between the power input and the components to which the third delay timer circuit 2256 is connected. The third delay timer circuit 2256 has a third predetermined delay value that is at least sufficiently greater than that of the second delay timer circuit 2222 such that the time delay difference therewith is substantially equal to, or greater than, the minimum pulse delay required to activate a conventional electronic grade latching coil relay. For example, the third delay timer circuit 2256 includes a 240K ohms resistor and a 2.2 microfarads capacitor combination defining a time delay value of about 400 ms following a power up of the host computer 12 (e.g. about 120 ms longer than the second delay timer circuit 2222).

Thus, as illustrated in a truth table form in FIG. 17, once the second delay timer circuit 2222 of the logic circuit first portion 2210 has elapsed, and before the third delay timer circuit 2256 has elapsed, the HIGH logic state, if present, of each logic converter first, second and third outputs 2264, 2266 and 2268 is each duplicated as a one time pulse transition lasting about 120 ms, on the logic pulse circuit first, second and third outputs 2274, 2276 and 2278 respectively, which form actuation circuit output ports to provide switching elements control signals configuring switching elements (described hereinbelow) to switching elements first and second configurations, to allow selection of the selected storage device port. The logic converter circuit 2252 is provided between the memory circuit output port and the actuation circuit output ports for converting the memory signals to switching elements control signals released at the actuation circuit output ports.

Once the third delay timer circuit 2256 has in turn elapsed, all outputs 2274, 2276 and 2278 of the logic pulse circuit 2254 are forced to a LOW logic state.

The truth table in FIG. 17 further illustrates the pulsed latching relay reset signal of about 250 ms issued substantially at the initialization of the selector 2000, e.g., after the first delay timer circuit 2220 has elapsed, but before the second delay timer circuit 2222 has elapsed.

In some embodiments of the selector 2000, the logic circuit second portion 2250 may further include a trigger circuit indicator enable output 2280 operatively coupled to the common trigger circuit input 2282 through a NOT, or INVERTER logic gate 2270. The trigger circuit indicator enable output 2280 is used in cooperative relation with the indicator circuit 2700 described further below.

Furthermore, as would be known to someone familiar with logic gates circuits, the logic converter circuit 2252 and logic pulse circuit 2254 can be economically assembled using a hex (or 6 channel) logic NOT gate IC such as the 74HC04, a quad 2-input AND gate IC such as the 74HC08, a quad 2-input OR gate IC such as the 74HC32. Other equivalent combinations of IC's and logic gate are also possible.

Thus, the logic circuit 2200 provides a means for latching a HIGH logic state corresponding to the active selector switch input terminal at power up of the host computer 12, and until the latter turned off. Furthermore, the logic circuit 2200 provides a means for converting the thus latched HIGH logic state to predetermined latching relay set signals.

A difference between the selector 2000 and the selector 1000 is that in the connection module of the selector 2000, there are switching elements in the predetermined number of storage device output port less one. Also the switching elements are connected to each other in a cascade. Each switching element includes a relay driver circuit and a latching relay. More specifically, referring to FIG. 13, the data relay circuit 2500 includes three (3) relay driver circuits 2510, 2512 and 2514 respectively, which are for example similar in size and configuration to the relay driver circuits 1310 of selector 1000 described further above. Each one of the relay driver circuits 2510, 2512 and 2514 includes a relay driver input terminal 2516 that is electrically coupled to a respective one of the logic pulse circuit first, second and third outputs 2274, 2276 and 2278.

The data relay circuit 2500 further includes two (2) latching relays, namely a first latching relay 2520 and a second latching relay 2530. Each latching relay 2520 and 2530 has for example at least nine (9) paired normally open (NO) and normally closed (NC) contacts. Namely NO contacts 2522 and NC contacts 2524 of latching relay 2520, and NO contacts 2532 and NC contacts 2534 of latching relay 2530 respectively, as illustrated in FIGS. 14 and 15. Alternatively, two groups of parallelly operated latching relays having each less than nine paired NO and NC contacts may be used.

Latching relays are well known in the art for having the ability to change and maintain a new state, either an activated (or latched) state or a deactivated (or unlatched) state, by simply receiving a suitable control voltage pulse at either one of their latching relay set or reset terminals. The new state is then maintained without requiring any power applied to the latching relay.

First latching relay 2520 has its relay set terminal 2526 electrically coupled to the coil input terminal of relay driver circuit 2512, its relay reset terminal 2528 electrically coupled to the coil input terminal of relay driver circuit 2510, and the opposite ends of the set and reset coils thereof to the +12 VDC supply terminal of the selector 2000.

In a similar manner, latching relay 2530 has its relay set terminal 2536 electrically coupled to the coil input terminal of relay driver circuit 2514, its relay reset terminal 2538 electrically coupled to the coil input terminal of relay driver circuit 2510, and the opposite ends of the set and reset coils thereof to the +12 VDC supply terminal of the selector 2000.

Thus, the data relay circuit 2500 provides a means for activating a predetermined combination of latching relays based on latching relay set signals issued by the logic circuit 2200.

Referring to FIG. 14, the data router circuit 2600 includes a host data port connector 2610, acting as the computing device port, and first, second and third device data port connectors 2612, 2614 and 2616 respectively, acting as the storage device ports. The host data port connector 2610 is for example a standard 7-pin SATA data male connector, while the first, second and third device data port connectors 2612, 2614 and 2616 are, in this example, each a standard 7-pin SATA data female connector. Other types of connectors are within the scope of the invention As can be observed in FIG. 14, the individual SATA data and ground lines, namely four data and three ground lines, of the host data port connector 2610 are individually electrically coupled to the corresponding SATA data and ground lines of the first, second and third device data port connectors 2612, 2614 and 2616 respectively. These SATA data and ground lines are individually electrically coupled through a suitable series arrangement of paired NO and NC contacts of the first and second latching relays 2520 and 2530 respectively. In a commercially available SATA data cable, the ground line extending between the two corresponding ground pins number four (4) of the SATA data connectors are typically routed through two individual electrical ground wires. Thus, in order to establish a working SATA data communication between the host computer 12 and a mass storage devices 14 operatively coupled through the contacts of one or both latching relays 2520 and 2530 of the selector 2000, the two individual electrical wires 2550 and 2552 representing the ground line between any two corresponding pins number 4 of the two device data port connectors involved, must typically be routed through two individual pairs of NO and NC contacts 2522 and 2524 respectively, as illustrated in FIG. 14.

Thus, when both latching relays 2520 and 2530 are both in a deactivated (or unlatched) state, such as when selector switch 2100 has its selector switch output first terminal 2112A selected, host data port connector 2610 is exclusively electrically coupled to first data port connector 2612.

When only the first latching relay 2520 is activated (or latched), such as when selector switch 2100 has its selector switch output second terminal 2112B selected, host data port connector 2610 is exclusively electrically coupled to second data port connector 2614.

And, finally, when both the first and second latching relays 2520 and 2530 are activated (or latched), such as when selector switch 2100 has its selector switch output third terminal 2112C selected, host data port connector 2610 is exclusively electrically coupled to third data port connector 2616.

Thus, the data router circuit 2600 makes use of the paired NO and NC contacts of the first and second latching relays 2520 and 2530, for establishing an exclusive connection between a SATA data port of the host computer 12 and the SATA data port of a user selected mass storage device 14, between which is operatively coupled the selector 2000. The activated and deactivated state of each latching relay to establish a user selected exclusive connection there between is governed by the latching relay state possibilities indicated in the truth table of FIG. 17.

Generally speaking, the cascade of switching elements is described as follows. Each of the switching elements including a switching element input port, first and second switching elements output ports, and a switching element control port. Each of the switching elements is configurable in a first and a second configuration through the switching element control port. The switching element is operable for transmitting data from the switching element input port to respectively the switching element first and second output ports respectively in the switching element first and second configurations. The switching elements are connected to each other such that each of the switching elements has the switching element first output port thereof connected to a respective one of the storage device ports and the switching element second output port thereof connected to the switching element input port of a next one of the switching elements in the cascade, except for a last switching element in the cascade which has the switching element second output port thereof connected to a last one of the storage device ports, a first one of the switching elements in the cascade having the switching element input port thereof connected to the computing device port. In the startup configuration, the connection module is operative for switching to the switching element second configuration all of the switching elements between the switching element input port and the switching element connected to the selected storage device port and for switching to the first configuration the switching element connected to the selected storage device port, except when the selected storage device port is the last one of the storage device ports, in which case the last switching element is configured to the switching element second configuration.

Thus, the data router circuit 2600 provides a means for establishing an exclusive hard wired connection between the host data port connector 2610 and the device data port connector 2612 or 2614 to which is coupled the user selected mass storage device 14, based on the states of the data relays of the data relay circuit 2500. In order to guarantee the 6 Gb/s data transfer rate typically achievable through a SATA data port of the host computer 12, in a "cascade mode" involving, for example, two selectors 2000 coupled in series, the host data port connector 2610 of the second selector 2000 is typically electrically coupled to the first device data port connector 2612 of the first selector 2000 directly coupled to the host computer 12. Thus, the SATA data communication pathway extending between the host computer 12 and the second selector 2000 goes through only only one set of latching relay NC contacts 2524 of the first selector 2000. Hence, any impedance typically induced by relay contacts routing high frequency data communication lines are kept at a minimum that generally does not affect the specified data transfer rate of 6 Gb/s.

Referring to FIG. 15, the indicator circuit 2700 includes one paired NO and NC relay contacts 2522 and 2524 of the first latching relay 2520, and one paired NO and NC relay contacts 2532 and 2534 of the second latching relay 2530, that are configured in a similar series arrangement of paired NO and NC relay contacts as in the data router circuit 2600.

This series arrangement of paired NO and NC relay contacts is suitably electrically coupled between the trigger circuit indicator enable output 2280 of the logic pulse circuit 2254 and three light emitting diodes (LED's) 2710 so as to establish an exclusive contact there between with only one of the LED's 2710.

Once the third predetermined delay has elapsed, the trigger circuit indicator enable output 2280 changes from a LOW to a HIGH logic state and, in turn, energizes the LED 2710 corresponding to the actively selected data port connector 2612, 2614 or 2616 of selector 2000 through the corresponding configuration of relay contacts.

Thus, the indicator circuit 2700 provides a means for visually confirming to the user which one of the device data ports of the selector 2000 is establishing an active data communication between a mass storage device 14 coupled thereto and the data port of the host computer 12.

A method of operation of the selector 2000 is substantially similar to the method of operation of selector 1000 described further above, although with the consideration that the selector switch 2100 allows a user to select one among up to three mass storage devices 14 only, instead of four.

Additionally to the advantages of selector 1000 mentioned further above, including the possibilities of a remotely controllable selector switch and a cascade mode of two or more selectors 2000, a significant advantage of the selector 2000, compared to known prior art selectors, resides in that it only requires sufficient power from the host computer 12 to drive the relatively small coils of the latching relays only for about half a second following a power up of the computer 12. For the rest of the time where the host computer 12 is kept powered up, only minimal power is required to essentially power the IC's and one of the LED's of the indicator circuit second portion 2750.

Furthermore, the general configuration of the selector 2000 requires only a minimal amount of components, typically only two latching relays and associated logic circuits, to allow a user to exclusively select one among three mass storage devices 14.

Likewise selector 1000, the selector 2000 may be substantially easily scaled up in terms of selectable SATA data connectors using additional standard components, like the ones described above, to directly select and access two, or more than three, mass storage devices 14.

Although the selector 2000 has been described as allowing a user to establish a communication between standard 7-pin SATA data ports, it would be obvious to someone familiar with the art that a communication may be established between other types of data ports such as, for example, USB ports, FireWire ports, IDE data ports, or the likes, using in some cases slightly scaled up logic circuit 2200, data relay circuit 2500 and data router circuit 2600.

FIGS. 3 and 18 to 25 inclusively show various aspects of a third embodiment of a mass storage device selector 3000, according to the present invention, hereinafter more simply referenced as the selector 3000. Since the selector 3000 is similar to the selectors 1000 and 2000, only the structure of a specific embodiment of the selector 3000 is described hereinbelow, with the understanding that the variants and generalizations mentioned hereinabove with respect to the selectors 1000 and 2000 also apply to the selector 3000 when suitable as seen by the person skilled in the art.

Likewise the selectors 1000 and 2000 described previously, the selector 3000 is typically operatively couplable between a host computer 12 and a plurality of mass storage devices 14. The selector 3000 is thus usable for allowing a user to securely and exclusively select and access only one of the mass storage devices 14 thus operatively coupled to the host computer 12 through the selector 3000.

As it will be described in details further below, the main difference of the selector 3000, relative to the selector 1000 and selector 2000, essentially resides in that it is both the power lines and data lines, instead of only one of the two, that are routed through the selector 3000, between the host computer 12 and exclusively one of the mass storage device 14 selected by the user. The selector 3000 therefore combines features of both selectors 1000 and 2000.

As it will be rendered apparent from the following description, the configuration of the selector 3000 takes advantage of the similarly configured circuit portions of the selector 1000 and 2000 to provide a selector 3000 requiring an assembly of a relatively small number of electronic components.

In the following description, the selector 3000 will be exemplified as allowing a user of the host computer 12 to exclusively select one among up to four (4) mass storage devices 14. Furthermore, the power and data lines routed through the selector 3000 are SATA power and data port lines respectively, of SATA compatible mass storage devices 14.

Figure 3:
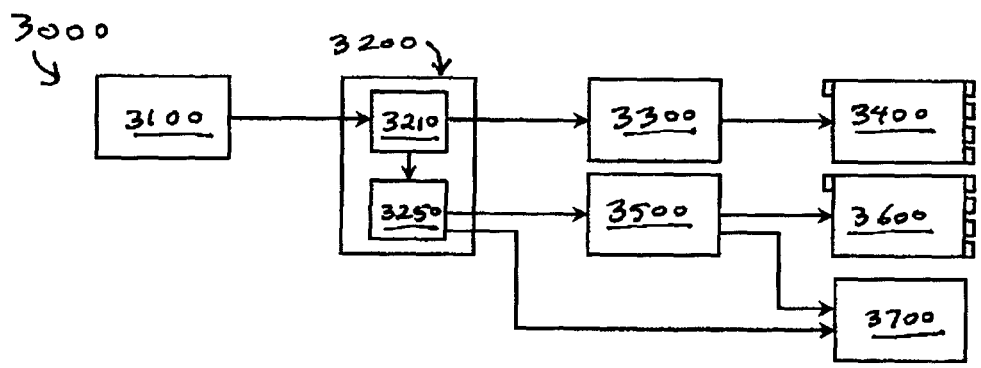

Referring more particularly to FIG. 3, some of the main circuits of the selector 3000 are substantially similar to the ones included in selector 1000 and selector 2000. Thus, the selector 3000 comprises a selector switch 3100, a logic circuit 3200 having input terminals electrically coupled to selected output terminals of the selector switch 3100, a power relay circuit 3300 having input terminals electrically coupled to selected output terminals of the logic circuit 3200, and a data relay circuit 3500 also having input terminals electrically coupled to selected output terminals of the logic circuit 3200.

The selector 3000 further comprises a power router circuit 3400 having input terminals electrically coupled to selected output terminals of the power relay circuit 3300, and a data router circuit 3600 having input terminals electrically coupled to selected output terminals of the data relay circuit 3500.

In some embodiments, the selector 3000 may further comprise an indicator circuit 3700 having input terminals electrically coupled to selected output terminals of the logic circuit 3200 and data relay circuit 3500.

The various circuits above are powered by a +12 VDC supply terminal, reference ground terminals, and a +5 VDC supply terminal of the selector 3000. As it will be described further below, these voltage supplies and reference ground terminals of the selector 3000 are provided through a SATA peripheral power connector of the host computer 12 to which is operatively coupled the selector 3000.

Figure 18:
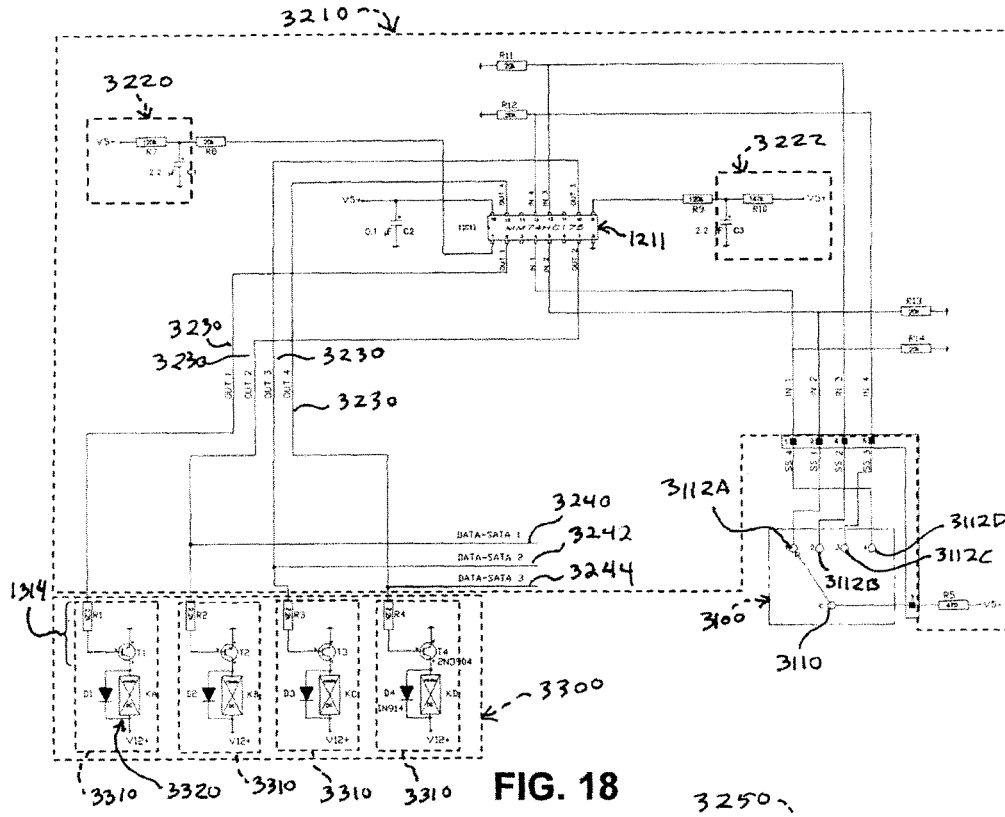
FIG. 18, in a schematic diagram, illustrates an assembly included in the mass storage device selector of FIG. 3, and comprising a selector switch, a logic circuit first portion and a power relay circuit.

With reference to FIG. 18, the selector switch 3100, likewise selector switch 1100 of selector 1000 illustrated in FIG. 4, may be typically represented by a commercially available single pole, 4-way manual rotary switch having a selector switch input terminal 3110 and four (4) selector switch output terminals. Namely selector switch first, second third and fourth output terminals 3112A, 3112B, 3112C and 3112D respectively.

The selector switch 3100 provides a means for manually selecting which one of the mass storage devices 14 coupled to the selector 3000 will be exclusively powered by the host computer 12 through a peripheral power port thereof, as well as in an exclusive data communication with the host computer 12 through a data port thereof.

Figure 19:
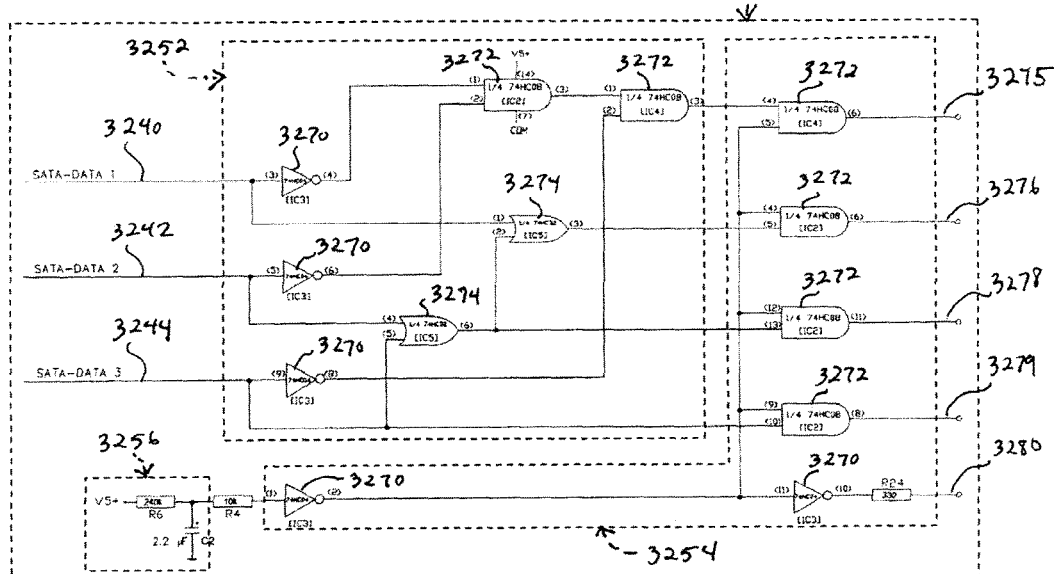
FIG. 19, in a schematic diagram, illustrates a logic circuit second portion included in the mass storage device selector of FIG. 3.

Referring to FIGS. 3, 18 and 19, the logic circuit 3200 is substantially similar to the logic circuit 2200 of selector 2000 (seen in FIG. 6) in that it includes a logic circuit first portion 3210 and a logic circuit second portion 3250.

Referring now more particularly to FIG. 18, logic circuit first portion 3210 is substantially similar to the logic circuit first portion 2210 of selector 1000 in that it includes a logic gate circuit 1211, such as a 16-pin high speed CMOS MM74HC175 IC, having each one of its four D-inputs 1214 electrically coupled to a respective one of the four selector switch output terminals 3112A, 3112B, 3112C and 3112D. As can be observed, when comparing the selector switch 1100 of the first selector 1000 in FIG. 4 with the selector switch 3100 in FIG. 18, the fourth output terminal 3112D of selector switch 3100 is electrically coupled in a cross-over fashion with the first D-input 1214, and the three other selector switch terminals offset upwardly by one position relative thereto. The purpose of this particular arrangement is described in details further below, along with a description of the data router circuit 3600. The logic circuit first portion 3210 further includes first and second delay timer circuit 3220 and 3222 having each a configuration and a time delay value that are substantially similar to the first and second delay timer circuit 2220 and 2222, are also electrically coupled in a similar way to the logic gate circuit 1211.

Thus, the logic circuit first portion 3210 provides a means for latching the HIGH logic state of the active selector switch output terminal at power up of the host computer 12, and until the latter is turned off.

Advantageously, the logic circuit first portion 3210 further includes logic circuit first portion first, second and third outputs 3240, 3242 and 3244 that are each electrically coupled to a respective one of the Q-outputs 1230 of a D-type Flip-Flop circuits 1212 of the logic gate circuit 1211 which, in turn, has its D-input 1214 operatively coupled to a respective one of the selector switch second, third and fourth terminal 3112B, 3112C and 3112D. Thus, the logic circuit first portion 3210 is rendered operatively compatible with both the power relay circuit 3300, as in selector 1000, and the logic circuit second portion 3250, as in selector 2000.

Referring now more particularly to FIG. 19, logic circuit second portion 3250 is substantially similar to the logic circuit second portion 2250 of selector 2000 in that it includes a logic converter circuit 3252, a logic pulse circuit 3254 and a third delay timer circuit 3256. The logic converter circuit 3252 and the logic pulse circuit 3254 are represented by suitable assemblies of NOT, AND and OR logic gates 3270, 3272 and 3274 respectively which, in combination with the third delay timer circuit 3256, are for converting the logic circuit first portion first, second and third outputs 3240, 3242 and 3244 into suitable latching relay control signals on logic pulse circuit first, second, third and fourth outputs 3275, 3276, 3278 and 3279 respectively.

Thus, the logic circuit second portion 3250 provides a logic pulse circuit first output 3275 that is used as a reset input signal, while the logic pulse circuit second, third and fourth outputs 3276, 3278 and 3279 are used as latching relay set and reset pulse signals to the latching relays included in the data relay circuit 3500, which will be described further below.

Likewise selector 2000, in some embodiments, the logic circuit second portion 3250 may further include a trigger circuit indicator enable output 3280.

Thus, the logic circuit 3200 provides a means for latching a HIGH logic state corresponding to the active selector switch output terminal at power up of the host computer 12, and until the latter is turned off. Furthermore, the logic circuit 3200 converts the thus latched HIGH logic state to predetermined latching relay set signals.

Referring again more particularly to FIG. 18, power relay circuit 3300 is substantially similar to the power relay circuit 1300 of selector 1000 in that it includes four (4) four relay driver circuits 1310. Each one of the four relay driver circuits 1310 is composed of a power relay 3320 that is electrically coupled to a respective one of the Q-outputs 3230 of the logic circuit first portion 3210 through a suitably configured transistor circuit 1314.

Thus, the power relay circuit 3300 provides a means for activating a power relay corresponding to the latched HIGH logic state provided by the logic circuit 3200.

Referring to FIG. 22, power router circuit 3400 is substantially similar to the power router circuit 1400 of selector 1000 in that it includes a power input connector 3410 electrically coupled in parallel to four (4) power output connectors 3420A, 3420B, 3420C and 3420D respectively.

The main difference of the power router circuit 3400 relative to the power router circuit 1400 essentially resides in that the power input connector 3410 is a 15-pin format male SATA power connector, at least the power output connector 3420A is a 15-pin format female SATA power connector, as illustrated in the figure, and the three other power output connectors 3420B, 3420C and 3420D are 12-pin format female SATA power connectors. It is well known in the art of computer connectors that the 15-pin format SATA power connectors have both +5 VDC and +12 VDC standard terminals, while the relatively smaller 12-pin format SATA power connectors have only +5 VDC standard terminals.

Thus, each one of the power output connectors 3420A to 3420D has its +5 VDC terminal electrically coupled to a corresponding voltage terminal of the power input connector 3410 through a NO relay contact 3430 of a respective one of the power relays 3320 of the power relay circuit 3300. The at least one power output connectors 3420A having a 15-pin female SATA power connector further includes an additional NO relay contact 3430 of the same corresponding power relay 3320, for electrically coupling its +12 VDC terminal to the corresponding +12 VDC terminals of the power input connector 3410.

It is to be noted that the +12 VDC supply, +5 VDC supply and reference ground terminals used to power the various elements of selector 3000, are electrically coupled to corresponding voltage and ground reference terminals of the power input connector 3410.

Thus, the power router circuit provides a means for establishing an exclusive hard wired connection between the power input connector coupled to the host computer, and the power output connector of the selector to which is electrically coupled the user selected mass storage device, based on the activated power relay of the power relay circuit.

Referring to FIG. 20, the data relay circuit 3500 includes, in a similar fashion as the data relay circuit 2500 of selector 2000, three (3) latching relays 3520, 3530 and 3540 each having their relay reset terminal 3528, 3538 and 3548 electrically coupled to the logic pulse circuit first output 3275 (or latching relay reset pulse signal) of the logic circuit second portion 3250, through a single relay driver circuit 3510.

The latching relays 3520, 3530 and 3540 each further have their relay set terminals 3526, 3536 and 3546 electrically coupled to the logic pulse circuit second, third and fourth outputs 3276, 3278, 3279 (or latching relay set pulse signals) respectively, through a respective one of relay driver circuits 3512, 3514 and 3516.

The relay driver circuits 3510, 3512, 3514 and 3516 are similarly configured and sized to the ones in relay driver circuit 2500 of selector 2000. The latching relays 3520, 3530 and 3540 are also similarly configured and sized to the ones in relay driver circuit 2500 of selector 2000 (e.g. each having at least nine paired NO and NC relay contacts). Alternatively, three groups of parallelly operated latching relays K1, K2 and K3, having each less than nine paired NO and NC contacts, may be used as illustrated in an exemplary schematic diagram in FIG. 25.

Thus, the three latching relays 3520, 3530 and 3540 are driven by the logic circuit second portion 3250 in a similar way as the latching relays of selector 2000, for operating the paired NO and NC contacts of the data router circuit 3600 described hereinafter. FIG. 21, in a logic truth table form, illustrates logic states within a data relay circuit 3500, relative to the position of the selector switch 3100, including the pulsed latching relay reset signal issued substantially at the initialization of the selector 3000.

To sum up differently the logic sequence described heretofore, immediately on power up of the host computer 12, the first, second and third delay timer circuit 3220, 3222 and 3256 each have their output voltage at a logic LOW state voltage level and each simultaneously start their differently timed voltage rise towards a logic HIGH state voltage level. Also immediately on power up of the host computer 12, the three latching relays 3512, 3514 and 3516 have their relay reset terminal 3528, 3538 and 3548 set to a logic HIGH state through the logic pulse circuit first output 3275.

Once the first delay timer circuit 3220 has reached a logic HIGH state voltage level, the initialization of the selector 3000 ends as the logic states of the four selector switch output terminals 3112A, 3112B, 3112C and 3112D are mirrored through a respective one of the four Q-outputs 3230 of the logic gate circuit 1211.

Also substantially simultaneously occurring when the first delay timer circuit 3220 has reached a logic HIGH state voltage level is a transition to a logic HIGH state of one or more of the latching relay set terminals 3526, 3536 and 3546, based on the position of the selector switch 3100. Next, once the second delay timer circuit 3222 has reached a logic HIGH state voltage level, which activates the common Clock input (CK) of the logic gate circuit 1211, the logic states of the selector switch terminals thus mirrored on the four Q-outputs 3230 are from then on permanently latched. At this point, it is to be noted that selected latching relay set terminals 3526, 3536 and 3546, based on the position of the selector switch 3100, are still in a logic HIGH state.

And finally, once the third delay timer circuit 3516 reaches a logic HIGH state voltage level, all latching relay set terminals 3526, 3536 and 3546 are simultaneously forced to a logic LOW state through the last stage of logic AND gates 3272 of the logic pulse circuit 3254 that controls their states. Also, substantially simultaneously as the third delay timer circuit 3516 reaches a logic HIGH state voltage level, the trigger circuit indicator enable output 3280 is activated. Thus, the third delay timer circuit 3256 has a predetermined time delay value that is relatively greater than the one of the second delay timer circuit 3222, and that the second delay timer circuit 3222 has a predetermined time delay value that is greater than the one the first delay timer circuit 3220.

Thus, the data relay circuit 3500 provides a means for activating a predetermined combination of latching relays based on latching relay set signals issued by the logic circuit.

Figure 24:
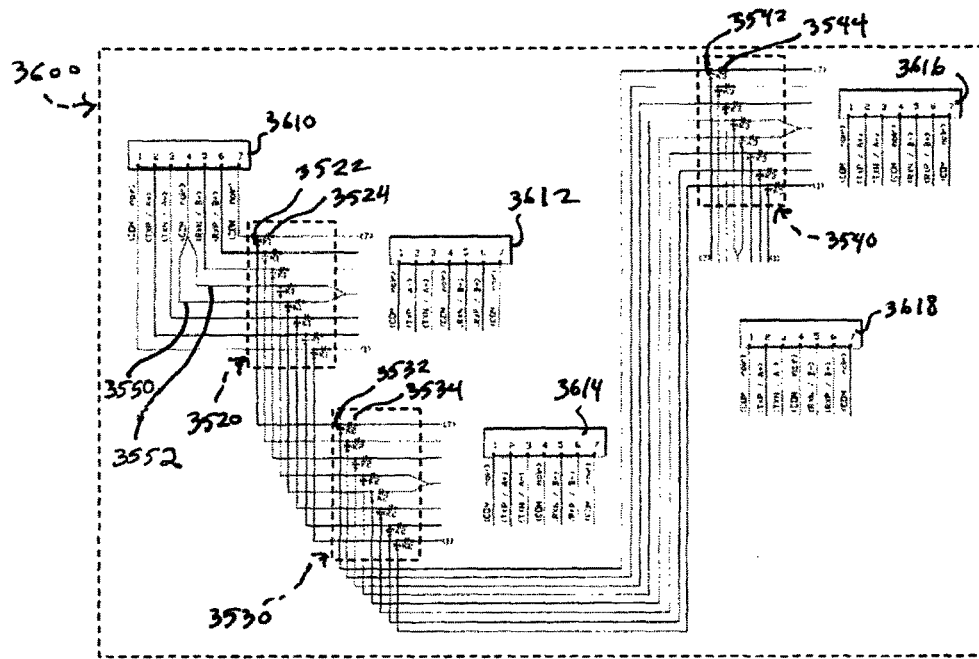
FIG. 24, in a schematic diagram, illustrates a data router circuit included in the mass storage device selector of FIG. 3.
Figure 25:
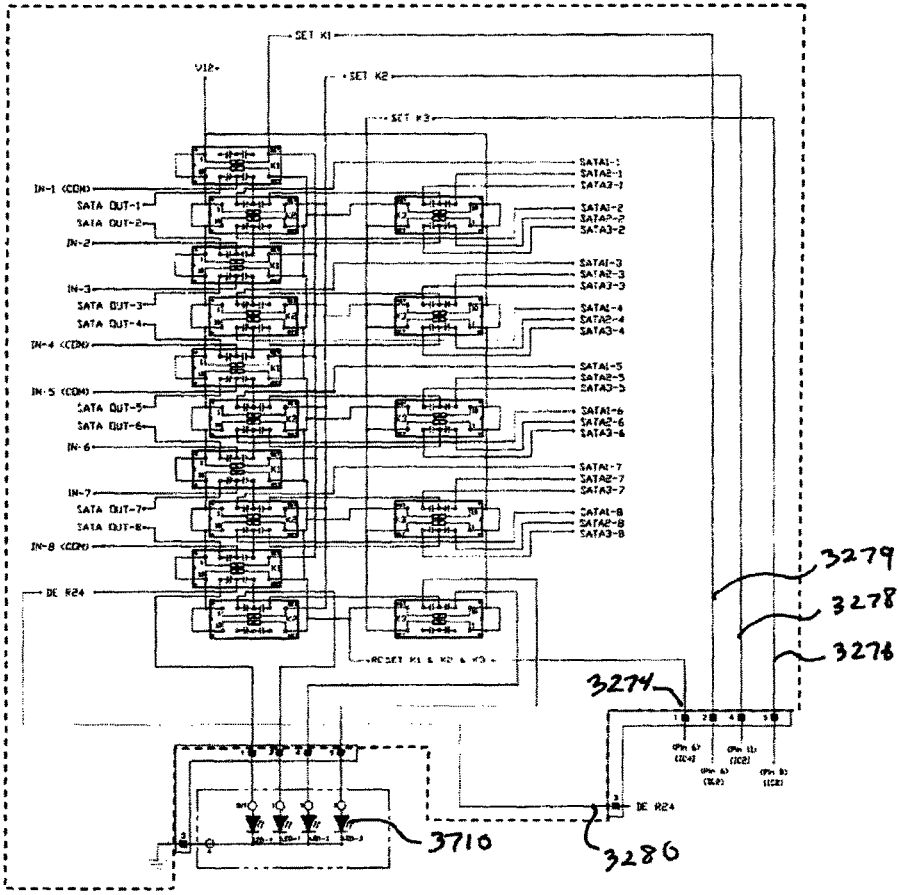
FIG. 25, in a schematic diagram, illustrates an alternate assembly of a plurality of latching relays having each two sets of paired Normally Open (NO) and Normally Closed (NO) contacts.

Referring to FIG. 24, the data router circuit 3600 is substantially similar in general configuration to the data router circuit 2600 (seen in FIG. 14) of selector 2000 in that it includes a host data port connector 3610, and first, second, third and fourth device data port connectors 3612, 3614, 3616 and 3618 respectively.

Also in a similar fashion as data router circuit 2600, the host data port connector 3610 is electrically coupled to the four device data port connectors 3612, 3614, 3616 and 3618 through a suitable series arrangement of respectively the paired NO and NC relay contacts 3522 and 3524 of latching relay 3520, the paired NO and NC relay contacts 3532 and 3534 of latching relay 3530, and the paired NO and NC relay contacts 3542 and 3544 of latching relay 3540.

And likewise data router circuit 2600, the host data port connector 2610 is a standard 7-pin SATA data male connector, while the first, second, third and fourth device data port connectors 3612, 3614, 3616 and 3618 are each a standard 7-pin SATA data female connector. Furthermore, as described for the selector 2000, in order to establish a working SATA data communication between the host computer 12 and a mass storage devices 14 operatively coupled through the contacts of one or more of the latching relays 3520, 3530 and 3540 of the selector 3000, the two individual electrical wires 3550 and 3552 representing the ground line between any two corresponding pins number 4 of the two device data port connectors involved, must be routed through two individual pairs of NO and NC contacts 3522 and 3524 respectively, as illustrated in FIG. 24.

Thus, the data router circuit 3600 makes use of the paired NO and NC contacts of the each latching relays 3520, 3530 and 3540, for establishing an exclusive connection between a SATA data port of the host computer 12 and one of the SATA data port of a user selected mass storage device 14, between which is operatively coupled the selector 3000. The activated and deactivated state of each latching relay establishes a user selected exclusive connection therebetween and is governed by the state possibilities indicated in the truth table of FIG. 21.

Thus, the data router circuit 3600 provides a means for establishing an exclusive hard wired connection between the host data port connector and the device data port connector to which is coupled the user selected mass storage device, based on the states of the data relays of the data relay circuit. As is the case with selector 2000, to guarantee a typical 6 Gb/sec. SATA data transfer rate in a cascade mode involving two selectors 3000, the host data port connector 3610 of the second selector 3000 is typically electrically coupled to the first device data port connector 3612 of the first selector 3000 directly coupled to the host computer 12. Correspondingly, the power input connector 3410 of the second selector 3000 is also typically electrically coupled to the first power output connector 3420A of the first selector 3000. As noted further above through the description of the logic circuit first portion 3210, when the fourth selector switch output terminal 3112D, thus electrically coupled in a cross-over fashion with the first D-input 1214 of the logic gate circuit 1211, is selected in a logic HIGH state, only the power relay 3320 associated thereof is activated so as to exclusively electrically couple the 15-pin power output connector 3420A with the power input connector 3410. Furthermore, none of the latching relays 3520, 3530 or 3540 is set, or latched, in an activated state such that, by default through the NO contacts 3524 of the first latching relay 3520, only the device data port connector 3612 is electrically coupled to the host data port connector 3610. Thus, with the selector switch 3100 of a first selector 3000 in its fourth position, the low impedance of a single set of NC contacts 352 thereof allows a full 6 Gb/sec. data transfer rate communicated through its corresponding device data port connector 3612, when a second selector 3000 has its host data port connector 3610 electrically coupled thereto in a cascaded mode between two selectors 3000. Is to be noted that, in a cascaded mode, the second selector 3000 also has its 15-pin male power input connector 3410 electrically coupled to the 15-pin female power output connector 3420A of the first selector 3000.

Referring to FIGS. 15 and 23, the indicator circuit 3700 is substantially similar in general configuration to the indicator circuit 2700 of selector 2000 in that it includes four LEDs 3710. Each one of the LEDs 3710 is electrically coupled to the trigger circuit indicator enable output 3280 of the logic circuit second portion 3250 through a cascaded arrangement of three (3) sets of paired NO and NC relay contacts. Namely relay contacts 3522 and 3524, 3532 and 3534, and 3542 and 3544, that are controlled by the latching relays 3520, 3530 and 3540 respectively.

Thus, the indicator circuit 3700 provides a means for visually confirming to the user of the selector 3000 which one of the device data ports is establishing an active communication between a mass storage device 14 coupled thereto and the host computer 12.

The advantages of the selector 3000, compared to known mass storage device selectors of the prior art are essentially represented by the combined advantages of selector 1000 and 2000 described further above in the present document, including the possibilities of a remotely controllable selector switch and a cascade mode of the power and data ports of one or more selectors 3000.

Likewise selectors 1000 and 2000, the selector 3000 may be substantially easily scaled up in terms of selectable power and SATA data connectors using additional standard components, like the ones described above, to directly select and access two, or more than three, mass storage devices 14.

Although the present invention has been described hereinabove by way of exemplary embodiments thereof, it will be readily appreciated that many modifications are possible in the exemplary embodiments without materially departing from the novel teachings and advantages of this invention. Accordingly, the scope of the claims should not be limited by the exemplary embodiments, but should be given the broadest interpretation consistent with the description as a whole. The present invention can thus be modified without departing from the spirit and nature of the subject invention as defined in the appended claims.

What is claimed is:

1. A selector for selecting one selected mass storage device to interface with a computing device, said selected mass storage device being selected from a group of mass storage devices including a predetermined number of mass storage devices, said predetermined number being larger than one, said selector comprising:

storage device ports in said predetermined number, each of said storage device ports being connectable to a respective one of said mass storage devices;

a computing device port connectable to said computing device;

a power input for powering said selector;

a selection interface configurable in a selected selection interface configuration from a group of selection interface configurations, said selection interface configurations in said group being present in said predetermined number, each of said selection interface configurations corresponding to selection of a respective one of said storage device ports as a selected storage device port, said selected mass storage device being connectable to said selected storage device port;

a connection module operatively coupled to said storage device ports, computing device port and selection interface for connecting said selected storage device port to said computing device port while disconnecting all other ones of said storage device ports from said computing device port when said selection interface is in said selected selection interface configuration;

said connection module being configurable between a startup configuration and a steady state configuration, wherein in said startup configuration, said connection module is operative for determining said selected selection interface configuration and connecting said selected storage device port to said computing device port, and, in said steady state configuration, said connection module is irresponsive to said selection interface so that a previously selected storage device port remains connected to said computing device port irrespective of said selection interface configuration;

wherein said selected storage device port and said computing device port are connected to each other so that said selector becomes transparent for said computing device and said selected mass storage device appears to said computing device as being directly connected thereto so as to interface therewith;

wherein said storage device and computing device ports include power ports for conveying electrical power from said computing device to said mass storage devices; and wherein said connection module includes switching elements in said predetermined number, each of said switching elements being provided between said computing device port and a respective one of said storage device ports, each of said switching elements being switchable between a closed configuration and an open configuration, wherein, in said open configuration, said computing device port and said respective one of said storage device ports are electrically disconnected from each other and in said closed configuration, said computing device port and said respective one of said storage device ports are electrically connected to each other by said switching element, said connection module being operative for configuring a selected switching element from said switching elements provided between said computing device port and said selected storage device port to said closed configuration and for configuring all other ones of said switching elements to said open configuration.

2. A selector as defined in claim 1, wherein said connection module is in said startup configuration for a predetermined period of time upon power being provided to said power input to power up said selector, said connection module automatically transitioning to said steady state configuration alter a predetermined transition delay after being powered up.

3. A selector as defined in claim 2, wherein said connection module remains in said steady state configuration unless electrical power is removed from said power input, at which point said connection module automatically resumes said startup configuration when next powered up.

4. A selector as defined in claim 1, wherein said storage device and computing device ports are combined power and data ports for conveying both electrical power from said computing device to said selected mass storage device and data signals between said computing device and said selected mass storage device.

5. A selector as defined in claim 4, wherein said data signals include electrical signals.

6. A selector as defined in claim 4, wherein said data signals include optical signals.

7. A selector as defined in claim 1, wherein said switching elements each include a relay and a relay driver for selectively actuating said relay.

8. A selector as defined in claim 1, wherein said computing device port includes at least two power supply lines providing said electrical power at different voltages, each of said storage device ports including at least two power receiving lines for each receiving said electrical power at a respective one of said voltages from said power supply lines.

9. A selector as defined in claim 1, wherein said selection interface includes selection interface output ports in said predetermined number and a selection interface input port electrically connected to said power input, said selection interface output ports being each associated to, a respective one of said selection interface configurations, a selected selection interface output port being electrically connected to said selection interface input port and all other ones of said selection interface output port being disconnected from said selection interface input port when said selection interface is configured in said selected selection interface configuration;

said connection module including a selection circuit provided between said selection interface output ports and said switching elements, said selection circuit associating each of said selection interface output ports to a respective one of said switching elements and being operative to switch to said closed configuration said selected switching element associated with said selected selection interface output port when said connection module is in said startup configuration.

10. A selector as defined in claim 9, wherein said selection circuit is a logic circuit.

11. A selector as defined in claim 10, wherein said selection circuit includes latches in said predetermined number each provided between a respective one of said selection interface output ports and a respective one of said switching elements.

12. A selector as defined in claim 11, wherein said latches each have a data input electrically connected to one of said selection interface output ports and a data output electrically connected to one of said switching elements, said switching elements being in said closed configuration when said data output connected thereto is in an active state and said switching elements being in said open configuration when said data output connected thereto is are an inactive state, said latches being configured such that when said connection module is in said startup configuration, only said latch connected to said selected selection interface output port has said data output thereof in said active state, all other ones of said latches having said data output thereof in said inactive state.

13. A selector as defined in claim 12, wherein said connection module is configured so that in said steady state configuration, said data outputs of all of said latches are unable to change said data outputs between said active and inactive states.

14. A selector as defined in claim 12, wherein said latches each have a clear input, said latches having said data output thereof in said inactive state when said clear input is activated.

15. A selector as defined in claim 14, wherein said connection module includes a first timer providing a first predetermined delay, said first timer being operatively coupled to said clear input for activating said clear input after said first predetermined delay from when said selector is powered up.

16. A selector as defined in claim 15, wherein said first timer includes a resistance/capacitor circuit provided between said clear inputs and said power input.

17. A selector as defined in claim 15, wherein
said latches each includes a clock input, said data output of said latches being able to change between said active and inactive states only when said clock input changes between two logic states; and
said connection module includes a second timer providing a second predetermined delay larger than said first predetermined delay, said second timer being operatively coupled to said clock inputs for changing a logic state of said clock input on all of said latches after said second predetermined delay from when said selector is powered up, said second timer being operatively coupled to said clock inputs for maintaining constant said logic state of said clock inputs after said second predetermined delay, thereby configuring said connection module to said steady state configuration.

18. A selector as defined in claim 17, wherein said second timer includes a resistance/capacitor circuit provided between said clock inputs and said power input.

19. A selector as defined in claim 9, wherein said selection interface includes a manual switch for selectively electrically connecting only said selected selection interface output port to said selection interface input port.

20. A selector as defined in claim 1, further comprising an indicator circuit operatively coupled to said connection module for indicating which one of said storage device ports is said selected storage device port.

21. A selector for selecting one selected mass storage device to interface with a computing device, said selected mass storage device being selected from a group of mass storage devices including a predetermined number of mass storage devices, said predetermined number being larger than one, said selector comprising:
    storage device ports in said predetermined number, each of said storage device ports being connectable to a respective one of said mass storage devices;
    a computing device port connectable to said computing device;
    a power input for powering said selector;
    a selection interface configurable in a selected selection interface configuration from a group of selection interface configurations, said selection interface configurations in said group being present in said predetermined number, each of said selection interface configurations corresponding to selection of a respective one of said storage device ports as a selected storage device port, said selected mass storage device being connectable to said selected storage device port;
    a connection module operatively coupled to said storage device ports, computing device port and selection interface for connecting said selected storage device port to said computing device port while disconnecting all other ones of said storage device ports from said computing device port when said selection interface is in said selected selection interface configuration;
    an indicator circuit operatively coupled to said connection module for indicating which one of said storage device ports is said selected storage device port;
    said connection module being configurable between a startup configuration and a steady state configuration, wherein in said startup configuration, said connection module is operative for determining said selected selection interface configuration and connecting said selected storage device port to said computing device port, and, in said steady state configuration, said connection module is irresponsive to said selection interface so that a previously selected storage device port remains connected to said computing device port irrespective of said selection interface configuration;
    wherein said selected storage device port and said computing device port are connected to each other so that said selector becomes transparent for said computing device and said selected mass storage device appears to said computing device as being directly connected thereto so as to interface therewith;
    wherein said indicator circuit includes light emitting diodes (LED) in said predetermined number and each associated with a respective one of said storage device ports, said indicator circuit being operatively coupled to said connection module for lighting only said LED associated with said selected storage device port.

22. A selector as defined in claim 4, wherein
said connection module includes switching elements in said predetermined number less one connected to each other in a cascade, each of said switching elements including a switching element input port, first and second switching elements output ports, and a switching element control port, each of said switching elements being configurable in a first and a second configuration through said switching element control port, said switching element being operable for transmitting data from said switching element input port to respectively said switching element first and second output ports respectively in said switching element first and second configurations, said switching elements being connected to each other such that each of said switching elements has said switching element first output port thereof connected to a respective one of said storage device ports and said switching element second output port thereof connected to said switching element input port of a next one of said switching elements in said cascade, except for a last switching element in said cascade which has said switching element second output port thereof connected to a last one of said storage device ports, a first one of said switching elements in said cascade having said switching element input port thereof connected to said computing device port;
in said startup configuration, said connection module is operative for switching to said switching element second configuration all of said switching elements between said switching element input port and said switching element connected to said selected storage device port and for switching to said first configuration said switching element connected to said selected storage device port, except when said selected storage device port is said last one of said storage device ports, in which case said last switching element is configured to said switching element second configuration.

23. A selector as defined in claim 22, wherein said switching elements each include
a normally open (NO) contact and a normally closed (NC) contact, said NO contact having NO contact input and output ports and said NC contact having NC contact input and output ports, said NO and NC contacts input ports being electrically connected to said switching element input ports and said NC and NO contacts output ports being electrically connected to respectively to said switching element first and second output ports, said NO and NC contacts being always together switched between open and closed states so that one and only one of said switching elements first and second output ports is electrically connected to said switching element input port at any time; and relay driver for selectively actuating said NO and NC contacts.

24. A selector as defined in claim 22, wherein said computing device port includes at least two computing device data lines and each of said storage device ports including at least two storage device data lines for each exchanging electrical data signals with a respective one of said computing device data lines when connected thereto.

25. A selector as defined in claim 22, wherein said connection module includes
   a memory circuit, said memory circuit including a memory circuit input port electrically connected to said selection interface for receiving therefrom selection interface input signals indicative of said selected selection interface configuration, a memory element for storing said selected selection interface configuration and a memory circuit output port for releasing memory signals indicative of said stored selected selection interface configuration; and
   a switching element actuation circuit including an actuation circuit input port electrically connected to said memory circuit output port for receiving said memory signals, actuation circuit output ports in said predetermined number less one each electrically coupled to said switching element control port of a respective one of said switching elements and a logic converter circuit provided between said memory circuit output port and said actuation circuit output ports for converting said memory signal to switching elements control signals released at said actuation circuit output ports, said switching elements control signals configuring said switching elements to said switching elements first and second configurations, to allow selection of said selected storage device port.

26. A selector as defined in claim 25, wherein said memory circuit includes latches, said latches each having a data input electrically connected to said selection interface and a data output electrically connected to said switching element actuation circuit, said connection module being configured so that in said steady state configuration, said data outputs of all of said latches are unable to change data output logic state.

27. A selector as defined in claim 26, wherein said latches each have a clear input, said latches having said data output thereof in an inactive state when said clear input is activated.

28. A selector as defined in claim 27, wherein said connection module includes a first timer providing a first predetermined delay, said first timer being operatively coupled to said clear inputs for activating said clear inputs after said first predetermined delay from when said selector is powered up.

29. A selector as defined in claim 28, wherein said first timer includes a resistance/capacitor circuit provided between said clear inputs and said power input.

30. A selector as defined in claim 28, wherein
   said latches each includes a clock input, said data output logic state being able to change only when said clock input changes between two logic states; and
   said connection module includes a second timer providing a second predetermined delay larger than said first predetermined delay, said second timer being operatively coupled to said clock inputs for changing a logic state of said clock input on all of said latches after said second predetermined delay from when said selector is powered up, said second timer being operatively coupled to said clock inputs for maintaining constant said logic state of said clock inputs after said second predetermined delay, thereby configuring said connection module to said steady state configuration.

31. A selector as defined in claim 30, wherein said second timer includes a resistance/capacitor circuit provided between said clock inputs and said power input.

32. A selector as defined in claim 30, wherein said switching elements include latching relays, said connection module includes a third timer providing a third predetermined delay larger than said second predetermined delay, said third timer being operatively coupled to said switching element actuation circuit for allowing issuance of said switching element control signals thereby only from when said selector is first powered up to said third predetermined delay.

33. A selector as defined in claim 32, wherein said third timer includes a resistance/capacitor circuit provided between said clock inputs and said power input.

34. A selector as defined in claim 22, wherein said selection interface includes a manual switch.

35. A selector as defined in claim 22, further comprising an indicator circuit operatively coupled to said connection module for indicating which one of said storage device ports is said selected storage device port.

36. A selector as defined in claim 35, wherein said indicator circuit includes light emitting diodes (LED) in said predetermined number and each associated with a respective one of said storage device ports, said indicator circuit being operatively coupled to said connection module for lighting only said LED associated with said selected storage device port.

37. A cascaded selector system, said cascaded selector system comprising a first selector and a second selector, said first and second selectors being as selector as defined in claim 1, said second selector having said computing device port thereof connected to one of said storage device port of said first selector.

38. A cascaded selector system as defined in claim 37, wherein in said first selector
   said storage device and computing device ports are combined power and data ports for conveying both electrical power from said computing device to said selected mass storage device and data signals between said computing device and said selected mass storage device;
   said connection module includes switching elements in said predetermined number less one connected to each other in a cascade, each of said switching elements including a switching element input port, first and second switching elements output ports, and a switching element control ort each of said switching elements being configurable in a first and a second configuration through said switching element control port, said switching element being operable for transmitting data from said switching element input port to respectively said switching element first and second output ports respectively in said switching element first and second configurations, said switching elements being connected to each other such that each of said switching elements has said switching element first output port thereof connected to a respective one of said storage device ports and said switching element second output port thereof connected to said switching element input port of a next one of said switching elements in said cascade, except for a last switching element in said cascade which has said switching element second output port thereof connected to a last one of said storage device ports, a first one of said switching elements in said cascade having said switching element input port thereof connected to said computing device port;

in said startup configuration, said connection module is operative for switching to said switching element second configuration all of said switching elements between said switching element input port and said switching element connected to said selected storage device port and for switching to said first configuration said switching element connected to said selected storage device port, except when said selected storage device port is said last one of said storage device ports, in which case said last switching element is configured to said switching element second configuration;

said switching elements each include a normally open (NO) contact and a normally closed (NC) contact, said NO contact having NO contact input and output ports and said NC contact having NC contact input and output ports, said NO and NC contacts input ports being electrically connected to said switching element input ports and said NC and NO contacts output ports being electrically connected to respectively to said switching element first and second output ports, said NO and NC contacts being always together switched between open and closed states so that one and only one of said switching elements first and second output ports is electrically connected to said switching element input port at any time; and a relay driver for selectively actuating said NO and NC contacts;

said second selector having said computing device port thereof connected to said storage device port of said first selector connected to a first one of said switching elements is said cascade.

* * * * *